(12) United States Patent
Saito et al.

(10) Patent No.: US 11,942,755 B2
(45) Date of Patent: Mar. 26, 2024

(54) OPTICAL TRANSMISSION SYSTEM AND FILTER PENALTY REDUCTION METHOD

(71) Applicant: Nippon Telegraph and Telephone Corporation, Tokyo (JP)

(72) Inventors: Kohei Saito, Tokyo (JP); Takashi Kotanigawa, Tokyo (JP); Tsutomu Kubo, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 678 days.

(21) Appl. No.: 16/972,331

(22) PCT Filed: May 29, 2019

(86) PCT No.: PCT/JP2019/021311
§ 371 (c)(1),
(2) Date: Dec. 4, 2020

(87) PCT Pub. No.: WO2019/253321
PCT Pub. Date: Dec. 12, 2019

(65) Prior Publication Data
US 2021/0234617 A1 Jul. 29, 2021

(30) Foreign Application Priority Data
Jun. 5, 2018 (JP) .................................. 2018-107958

(51) Int. Cl.
*H01S 3/13* (2006.01)
*H01S 5/00* (2006.01)
(Continued)

(52) U.S. Cl.
CPC .......... *H01S 5/0014* (2013.01); *H01S 5/0021* (2013.01); *H01S 5/005* (2013.01);
(Continued)

(58) Field of Classification Search
CPC ...... H01S 5/0014; H01S 5/0021; H01S 5/005; H01S 5/0078; H01S 5/02251;
(Continued)

(56) References Cited

U.S. PATENT DOCUMENTS

2011/0135305 A1* 6/2011 Barnard .................. H04L 45/50
398/49
2012/0141130 A1* 6/2012 Nakashima .......... H04B 10/572
398/187
2019/0379461 A1* 12/2019 Irie ....................... H04B 10/572

FOREIGN PATENT DOCUMENTS

JP 2002-290331 10/2002
JP 2005-347941 12/2005
(Continued)

OTHER PUBLICATIONS

Openroadm.org, [online], "Open ROADM MSA," 2016, retrieved on Apr. 6, 2018, retrieved from URL<http://www.openroadm.org/home.html>, 3 pages.
(Continued)

*Primary Examiner* — Kinam Park
(74) *Attorney, Agent, or Firm* — Fish & Richardson P.C.

(57) ABSTRACT

[Problem] To reduce a filter penalty caused by narrowing of an optical signal band due to optical filters having a multiplexing/demultiplexing function in an optical transmission line between transponder units.
[Solution] In an optical transmission system 10A, transponder units 21a to 21n and 22a to 22n connected by optical fibers 14 in which optical filters having a multiplexing/demultiplexing function of an optical signal are interposed include a transmission unit 22 that transmits the optical signal obtained by modulating laser light from a laser light source 34 with an electric signal from a communication apparatus to the optical fibers 14, and a reception unit 23 that receives the optical signal from the optical fibers 14 and
(Continued)

converts the received optical signal into an electric signal. The reception unit 23 includes a BER measurement unit that measures a BER, based on a received signal, and feeds the measured BER back to a transmitting side. The transmission unit 22 includes a frequency shift control unit that performs frequency shift control of making a center frequency of the laser light match a center frequency of the received optical signal so that the fed back BER is minimized.

10 Claims, 15 Drawing Sheets

(51) Int. Cl.
*H01S 5/02251* (2021.01)
*H04B 10/079* (2013.01)
*H04B 10/572* (2013.01)
*H04B 10/50* (2013.01)
*H04J 14/02* (2006.01)

(52) U.S. Cl.
CPC ........ *H01S 5/0078* (2013.01); *H01S 5/02251* (2021.01); *H04B 10/0795* (2013.01); *H04B 10/07953* (2013.01); *H04B 10/0799* (2013.01); *H04B 10/572* (2013.01); *H04B 10/0793* (2013.01); *H04B 10/503* (2013.01); *H04J 14/0202* (2013.01)

(58) Field of Classification Search
CPC .......... H04B 10/0795; H04B 10/07953; H04B 10/0799; H04B 10/572
See application file for complete search history.

(56) References Cited

FOREIGN PATENT DOCUMENTS

| | | |
|---|---|---|
| JP | 2006-165885 | 6/2006 |
| JP | 2012-120010 | 6/2012 |
| JP | 2016-139976 | 8/2016 |

OTHER PUBLICATIONS

Santos et al., "On the Impact of Deploying Optical Transport Networks Using Disaggregated Line Systems," J. Opt. Commun. Netw., Jan. 2018, 10(1):A60-A68.

* cited by examiner

OPTICAL TRANSMISSION SYSTEM AND FILTER PENALTY REDUCTION METHOD

CROSS-REFERENCE TO RELATED APPLICATIONS

This application is a National Stage application under 35 U.S.C. § 371 of International Application No. PCT/JP2019/021311, having an International Filing Date of May 29, 2019, which claims priority to Japanese Application Serial No. 2018-107958, filed on Jun. 5, 2018. The disclosure of the prior application is considered part of the disclosure of this application, and is incorporated in its entirety into this application.

TECHNICAL FIELD

The present invention relates to an optical transmission system and a method of reducing a filter penalty that prevent deterioration in signal quality, which is caused due to a process in which optical signals transmitted to an optical transmission line from transponder units performing transmission and reception of optical signals are subject to narrowing of a spectral band due to optical filters having a multiplexing/demultiplexing function that are interposed in the optical transmission line.

BACKGROUND ART

FIG. 15 is a block diagram illustrating a configuration of an optical transmission system 10 of the related art. The optical transmission system 10 includes a plurality of transponder units 11a to 11n, an optical multiplexer/demultiplexer unit 12a, an optical amplification unit 13a, optical fibers 14, a plurality of optical cross connect units 15a and 15n, an optical amplification unit 13b, an optical multiplexer/demultiplexer unit 12b, and a plurality of transponder units 16a to 16n. The plurality of transponder units 11a to 11n, the optical multiplexer/demultiplexer unit 12a, and the optical amplification unit 13a are disposed on the side of one of two ends being remote locations. The optical fibers 14 connect the two ends. The plurality of optical cross connect units 15a and 15n are interposed between the optical fibers 14. The optical amplification unit 13b, the optical multiplexer/demultiplexer unit 12b, and the plurality of transponder units 16a to 16n are disposed on the side of the other end. The optical transmission system 10 employs bidirectional communication. However, the following is a description of a case where optical signals are transmitted from the transponder units 11a to 11n on the left side (transmitting side) of the figure to the transponder units 16a to 16n on the right side (receiving side).

The optical transmission system 10 employs the wavelength division multiplexing (WDM) method. In the optical transmission system 10, the transponder units 11a to 11n transmit and receive optical signals that have different wavelengths and are multiplexed into a WDM signal. The transponder units 11a to 11n further receive input of electric signals from an outside communication apparatus.

The electric signals are converted into optical signals in respective transponder units 11a to 11n, multiplexed in the optical multiplexer/demultiplexer unit 12a, and amplified in the optical amplification unit 13a, to be transmitted to the optical fibers 14. In the optical fibers 14, the optical signals are added/dropped by the optical cross connect units 15a and 15n. After being transmitted through the optical fibers 14 as described above, the optical signals are amplified in the optical amplification unit 13b on the receiving side, demultiplexed in the optical multiplexer/demultiplexer unit 12b, and received in respective transponder units 16a to 16n, to be transmitted to a communication apparatus (not illustrated).

In recent years, regarding such optical transmission systems 10 having a configuration as described above, organizations, such as Open Reconfigurable Optical Add/Drop Multiplexer (ROADM) MSA, have been attempting to achieve implementation by using a configuration in which transponder units and units other than the transponder units, specifically ROADM units (common units) including the optical multiplexer/demultiplexer units 12a and 12b and the optical cross connect units 15a and 15n, are separated. Note that the ROADM refers to a multiplexer apparatus that performs reconfigurable Add/Drop of optical signals.

As described in NPLs 1 and 2, the attempt involves a requirement of λ connection configuration, where products of different manufacturers are used for the transponder units and the common units. Specifically, there is a requirement that existing units be used for the common units and the transponder units be replaceable.

CITATION LIST

Non Patent Literature

NPL 1: "Open ROADM MSA", [online], 2016, [searched on 28 May 2018], the Internet <URL: http://www.openroadm.org/home.html>

NPL 2: Joao Santos, et al., "On the Impact of Deploying Optical Transport Networks Using Disaggregated Line Systems". J. OPT. COMMUN. NETW., VOL. 10, O. 1, January 2018.

SUMMARY OF THE INVENTION

Technical Problem

An optical filter having an optical multiplexing/demultiplexing function, such as a wavelength selective switch, is incorporated into each of intermediate units of the optical transmission system 10 described above, specifically the optical multiplexer/demultiplexer units 12a and 12b and the optical cross connect units 15a and 15n, for example. Each individual optical filter has a frequency shift. When such frequency shifts are superimposed on the optical signals, what is termed narrowing occurs, in which the spectral band of the optical signals is narrowed.

The narrowing will be described with reference to signal waveforms illustrated on the upper side of FIG. 15. It is herein assumed that each optical signal output from the transponder units 11a to 11n has a frequency band expanding on both sides of a center frequency f0, as illustrated by a signal waveform W1 in a graph having a vertical axis representing power P and a horizontal axis representing frequency f. The optical signal has a signal waveform W1a of a band in which the center frequency f0 is shifted to f1 due to an optical filter of the optical multiplexer/demultiplexer unit 12a on the transmitting side, and has a signal waveform W1b of a band in which the center frequency f0 is shifted to f2 due to an optical filter of the optical cross connect unit 15a. In a similar manner, the optical signal has a signal waveform W1c of a band in which the center frequency f0 is shifted to f3 due to an optical filter of the optical cross connect unit 15n, and has a signal waveform W1a of a band in which the center frequency f0 is shifted to f4 due to an optical filter of the optical multiplexer/demultiplexer unit 12*n*.

When the shifts in the frequency bands illustrated by the signal waveforms W1*a* to W1*d* described above are superimposed, narrowing occurs, in which a spectral band B1 is narrowed as illustrated by a signal waveform W2. Due to the narrowing, signals to be received in the transponder units 16*a* to 16*n* each have a signal waveform W2 of such a narrow band whose center frequency is shifted to a center frequency f5, which is shifted from the original center frequency f0 on the transmitting side by frequency fD. There is a problem in that occurrence of narrowing as described above leads to occurrence of a filter penalty, which causes deterioration in quality of received signals.

The present invention is made in view of the circumstances as described above, and has an object to provide an optical transmission system and a method of reducing a filter penalty capable of reducing a filter penalty caused by narrowing of an optical signal band due to optical filters having a multiplexing/demultiplexing function in an optical transmission line between transponder units.

Means for Solving the Problem

As a means for solving the problem described above, the invention recited in claim 1 is an optical transmission system including a transponder unit on a transmitting side and a transponder unit on a receiving side. The transponder units perform transmission and reception of an optical signal through an optical transmission line in which an optical filter having a multiplexing/demultiplexing function of the optical signal is interposed. The transponder units each include a transmission unit and a reception unit. The transmission unit transmits the optical signal obtained by modulating laser light emitted from a laser light source with an electric signal from a communication apparatus to the optical transmission line. The reception unit receives the optical signal from the transmission unit through the optical transmission line and converts the received optical signal into an electric signal. The reception unit includes a bit error rate (BER) measurement unit that measures a BER, based on a received signal of the transponder unit on the receiving side, and feeds the measured BER back to the transponder unit on the transmitting side. The transmission unit includes a control unit that performs frequency shift control of shifting a center frequency of the laser light emitted from the laser light source in accordance with the fed back BER so that the center frequency approaches a center frequency of the optical signal received in the transponder unit on the receiving side. The control unit performs the frequency shift control so that a value of the fed back BER is minimized.

The invention recited in claim 8 is a method of reducing a filter penalty used in an optical transmission system, which includes a transponder unit on a transmitting side and a transponder unit on a receiving side. The transponder units perform transmission and reception of an optical signal through an optical transmission line in which an optical filter having a multiplexing/demultiplexing function of the optical signal is interposed. The transponder units each include a transmission unit and a reception unit. The transmission unit transmits the optical signal obtained by modulating laser light emitted from a laser light source with an electric signal from a communication apparatus to the optical transmission line. The reception unit receives the optical signal from the transmission unit through the optical transmission line and converts the received optical signal into an electric signal. The method includes: measuring, by the reception unit, a BER, based on a received signal of the transponder unit on the receiving side, and feeding the measured BER back to the transponder unit on the transmitting side; performing, by the transmission unit, frequency shift control of shifting a center frequency of the laser light emitted from the laser light source in accordance with the fed back BER so that the center frequency approaches a center frequency of the optical signal received in the transponder unit on the receiving side; and performing, by the transmission unit, the frequency shift control so that a value of the fed back BER is minimized.

According to the configuration recited in claim 1 and the method recited in claim 8, when the value of the BER fed back to the transmitting side is minimized as a result of the frequency shift control, the center frequency of the laser light matches the center frequency of the optical signal shifted on the receiving side. The matching allows for reduction of narrowing of the optical signal on the receiving side. As a result, a filter penalty causing deterioration in quality of a received signal can be reduced.

The invention recited in claim 2 is the optical transmission system according to claim 1, wherein the transmission unit includes an encoder unit that encodes the electric signal from the communication apparatus into a multi-level signal, a digital/analog conversion unit that converts the multi-level signal output from the encoder unit into a digital signal, a quadrature modulation unit that outputs signal light obtained by performing quadrature modulation on the laser light with the multi-level signal being the converted digital signal, and a phase control unit that performs variable phase control of causing phase of the multi-level signal from the encoder unit to be advanced or delayed, in accordance with the fed back BER. The phase control unit performs the variable phase control so that the value of the fed back BER is minimized.

According to the configuration, when the value of the BER fed back to the transmitting side is minimized as a result of the variable phase control, the center frequency of the laser light matches the center frequency of the optical signal shifted on the receiving side. The matching allows for reduction of narrowing of the optical signal on the receiving side, and a filter penalty on the receiving side can be thereby reduced.

The invention recited in claim 3 is the optical transmission system according to claim 1, wherein the transmission unit includes an encoder unit that encodes the electric signal from the communication apparatus into a multi-level signal, and a Nyquist control unit that performs Nyquist control on the frequency filter in accordance with the fed back BER. The encoder unit includes a frequency filter related to the encoding. The Nyquist control is control of making a signal spectrum of the electric signal from the communication apparatus passing through the frequency filter have a Nyquist form, in which a rectangular waveform due to cutoff characteristics of a signal includes a larger number of main signal components. The Nyquist control unit performs the Nyquist control so that the value of the fed back BER is minimized.

According to the configuration, the Nyquist form is such a form that cutoff characteristics of a signal have a steep rectangular shape, and a larger number of main signal components are included in a narrow band including the center frequency of such a rectangular shape. This allows the optical signal having the Nyquist form transmitted from the transponder unit on the transmitting side to maintain the main signal components even under the influence of narrowing due to the optical filter having the optical multiplexing/demultiplexing function in the optical transmission line. As a result, deterioration in signal quality can be prevented. Consequently, a filter penalty on the receiving side can be reduced.

The invention recited in claim 4 is an optical transmission system including a transponder unit on a transmitting side and a transponder unit on a receiving side. The transponder units perform transmission and reception of an optical signal through an optical transmission line in which an optical filter having a multiplexing/demultiplexing function of the optical signal is interposed. The transponder units each include a transmission unit and a reception unit. The transmission unit transmits the optical signal obtained by modulating laser light emitted from a laser light source with an electric signal from a communication apparatus to the optical transmission line. The reception unit receives the optical signal from the transmission unit through the optical transmission line and converts the received optical signal into an electric signal. The reception unit includes an optical power measurement unit that measures optical power of the optical signal received in the transponder unit on the receiving side, and feeds the measured optical power back to the transponder unit on the transmitting side. The transmission unit includes a control unit that performs frequency shift control of shifting a center frequency of the laser light emitted from the laser light source in accordance with the fed back optical power so that the center frequency approaches a center frequency of the optical signal received in the transponder unit on the receiving side. The control unit performs the frequency shift control so that the fed back optical power is maximized.

According to the configuration, when the optical power fed back to the transmitting side is maximized as a result of the frequency shift control, the center frequency of the laser light matches the center frequency of the optical signal shifted on the receiving side. The matching allows for reduction of narrowing of the optical signal on the receiving side. As a result, a filter penalty causing deterioration in quality of a received signal can be reduced. Further, for the measurement of the optical power, measurement of optical power itself received in a photodiode being a component of the transponder unit suffices. As a result, implementation can be achieved with a simple configuration. In addition, light is used in the control. As a result, high speed control can be implemented.

The invention recited in claim 5 is the optical transmission system according to claim 4, wherein the transmission unit includes an encoder unit that encodes the electric signal from the communication apparatus into a multi-level signal, a digital/analog conversion unit that converts the multi-level signal output from the encoder unit into a digital signal, a quadrature modulation unit that outputs signal light obtained by performing quadrature modulation on the laser light with the multi-level signal being the converted digital signal, and a phase control unit that performs variable phase control of causing phase of the multi-level signal from the encoder unit to be advanced or delayed, in accordance with the fed back optical power. The phase control unit performs the variable phase control so that the fed back optical power is maximized.

According to the configuration, when the optical power fed back to the transmitting side is maximized as a result of the variable phase control, the center frequency of the laser light matches the center frequency of the optical signal shifted on the receiving side. The matching allows for reduction of narrowing of the optical signal on the receiving side, and a filter penalty on the receiving side can be thereby reduced.

The invention recited in claim 6 is the optical transmission system according to claim 4, wherein the transmission unit includes an encoder unit that encodes the electric signal from the communication apparatus into a multi-level signal, and a Nyquist control unit that performs Nyquist control on the frequency filter so that the fed back optical power is minimized. The encoder unit including a frequency filter related to the encoding. The Nyquist control is control of making a signal spectrum of the electric signal from the communication apparatus passing through the frequency filter have a Nyquist form, in which a rectangular waveform due to cutoff characteristics of a signal includes a larger number of main signal components. The Nyquist control unit performs the Nyquist control so that a value of the fed back optical power is minimized.

The configuration allows the optical signal having the Nyquist form transmitted from the transponder unit on the transmitting side to maintain the main signal components even under the influence of narrowing due to the optical filter having the optical multiplexing/demultiplexing function in the optical transmission line. As a result, deterioration in signal quality can be prevented. Consequently, a filter penalty on the receiving side can be reduced.

The invention recited in claim 7 is an optical transmission system including a transponder unit on a transmitting side and a transponder unit on a receiving side. The transponders performs transmission and reception of an optical signal through an optical transmission line in which an optical filter having a multiplexing/demultipexing function of the optical signal is interposed. The transponder units each includes a transmission unit and a reception unit. The transmission unit transmits the optical signal obtained by modulating laser light emitted from a laser light source with an electric signal from a communication apparatus to the optical transmission line. The reception unit receives the optical signal from the transmission unit through the optical transmission line and converts the received optical signal into an electric signal. The reception unit includes an optical power measurement unit that measures optical power of the optical signal received in the transponder unit on the receiving side, and a control unit that determines a frequency shift amount by which a center frequency of the optical filter is shifted so that the measured optical power is maximized, and transmits the determined frequency shift amount to the optical filter.

According to the configuration, the frequency shift amount is determined while measuring the optical power of the received optical signal from the optical transmission line, and the center frequency of the optical filter having the multiplexing/demultiplexing function of the optical signal interposed in the optical transmission line is shifted by the frequency shift amount. When the measured optical power is maximized as a result of the shift, the center frequency of the laser light from the laser light source on the transmitting side and the center frequency of the optical signal shifted on the receiving side match each other. The matching allows for reduction of narrowing of the optical signal on the receiving side. As a result, a filter penalty causing deterioration in quality of a received signal can be reduced.

Effects of the Invention

According to the present invention, an optical transmission system and a method of reducing a filter penalty capable of reducing a filter penalty caused by narrowing of an optical signal band due to optical filters having a multiplexing/demultiplexing function in an optical transmission line between transponder units can be provided.

DESCRIPTION OF EMBODIMENTS

Embodiments of the present invention will be described below with reference to the drawings. Note that components common throughout the drawings of this specification are denoted by the same reference signs, and description of such components will be omitted as appropriate.

Configuration of First Embodiment

Figure 1:
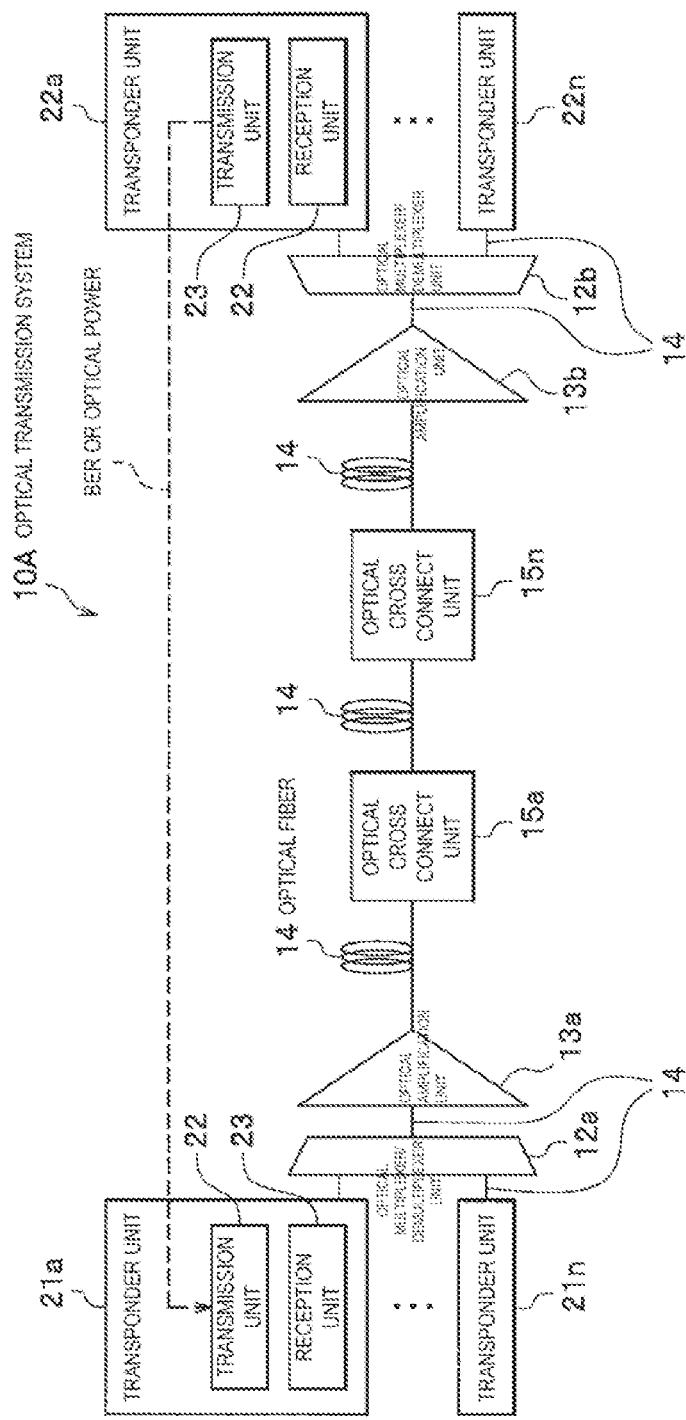
FIG. 1 is a block diagram illustrating a configuration of an optical transmission system according to a first embodiment of the present invention.

FIG. 1 is a block diagram illustrating a configuration of an optical transmission system according to a first embodiment of the present invention.

Figure 15:
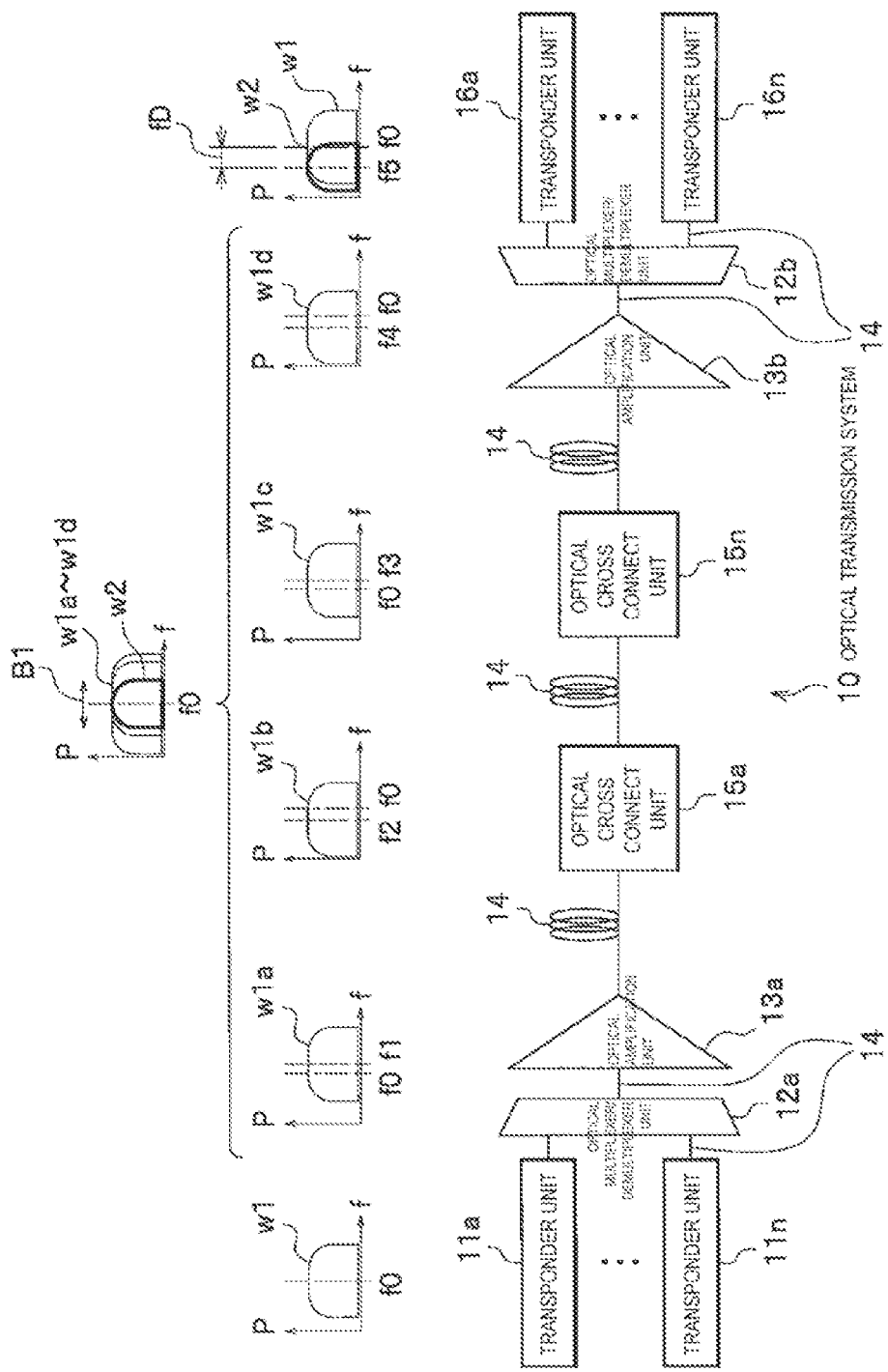
FIG. 15 is a block diagram illustrating a configuration of an optical transmission system of related art.

An optical transmission system 10A illustrated in FIG. 1 is different from the optical transmission system 10 (FIG. 15) of related art in the following respects. The optical transmission system 10A measures a bit error rate (BER) of a received signal by using transponder units 22a to 22n on a receiving side, and feeds the BER back to a transmitting side. The feedback is performed via optical fibers 14. In addition, the optical transmission system 10A is different from the optical transmission system 10 of the related art in that control of shifting the center frequency of laser light is performed in transponder units 21a to 21n on the transmitting side so that the fed back BER is minimized. For the sake of such a configuration, the optical transmission system 10A includes a transmission unit 22 and a reception unit 23 (described later) in each of the transponder units 21a to 21n and 22a to 22n on the transmitting side and the receiving side, respectively.

Figure 2:
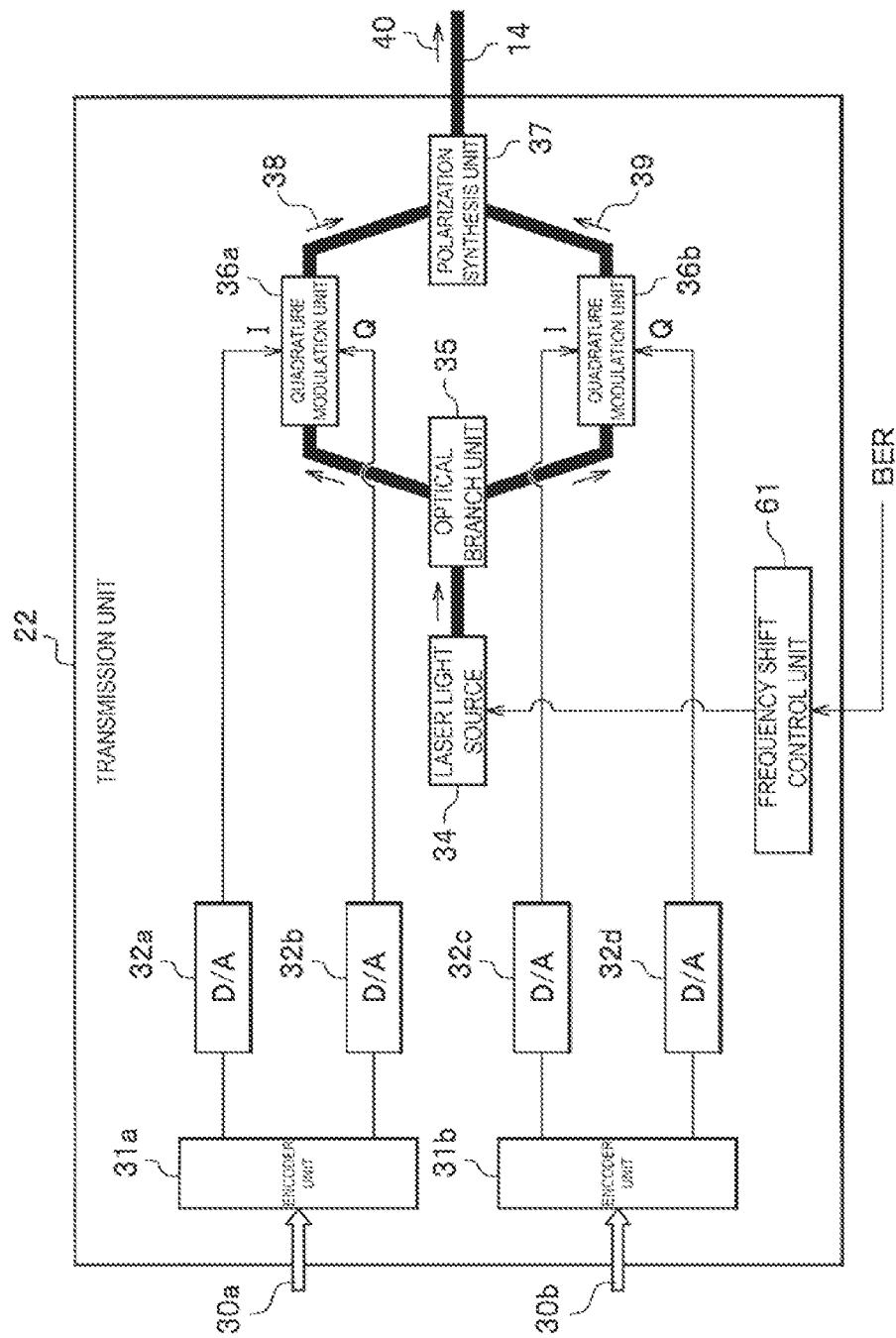
FIG. 2 is a block diagram illustrating a configuration of a transmission unit of the optical transmission system according to the first embodiment.

As illustrated in FIG. 2, the transmission unit 22 converts input information signals 30a and 30b being incoming electric signals transmitted from a communication apparatus (not illustrated) to an optical signal 40, and transmits the converted optical signal 40 to the optical fibers 14. The transmission unit 22 includes encoder units 31a and 31b, digital/analog conversion units (D/As) 32a, 32b, 32c, and 32d, a laser light source 34, an optical branch unit 35, quadrature modulation units 36a and 36b, a polarization synthesis unit 37, and a frequency shift control unit 61 (also referred to as a control unit 61) constituting a characteristic element of the present invention. Note that the optical fibers 14 constitute an optical transmission line as recited in claims. The frequency shift control unit 61 constitutes a control unit as recited in claims.

Figure 3:
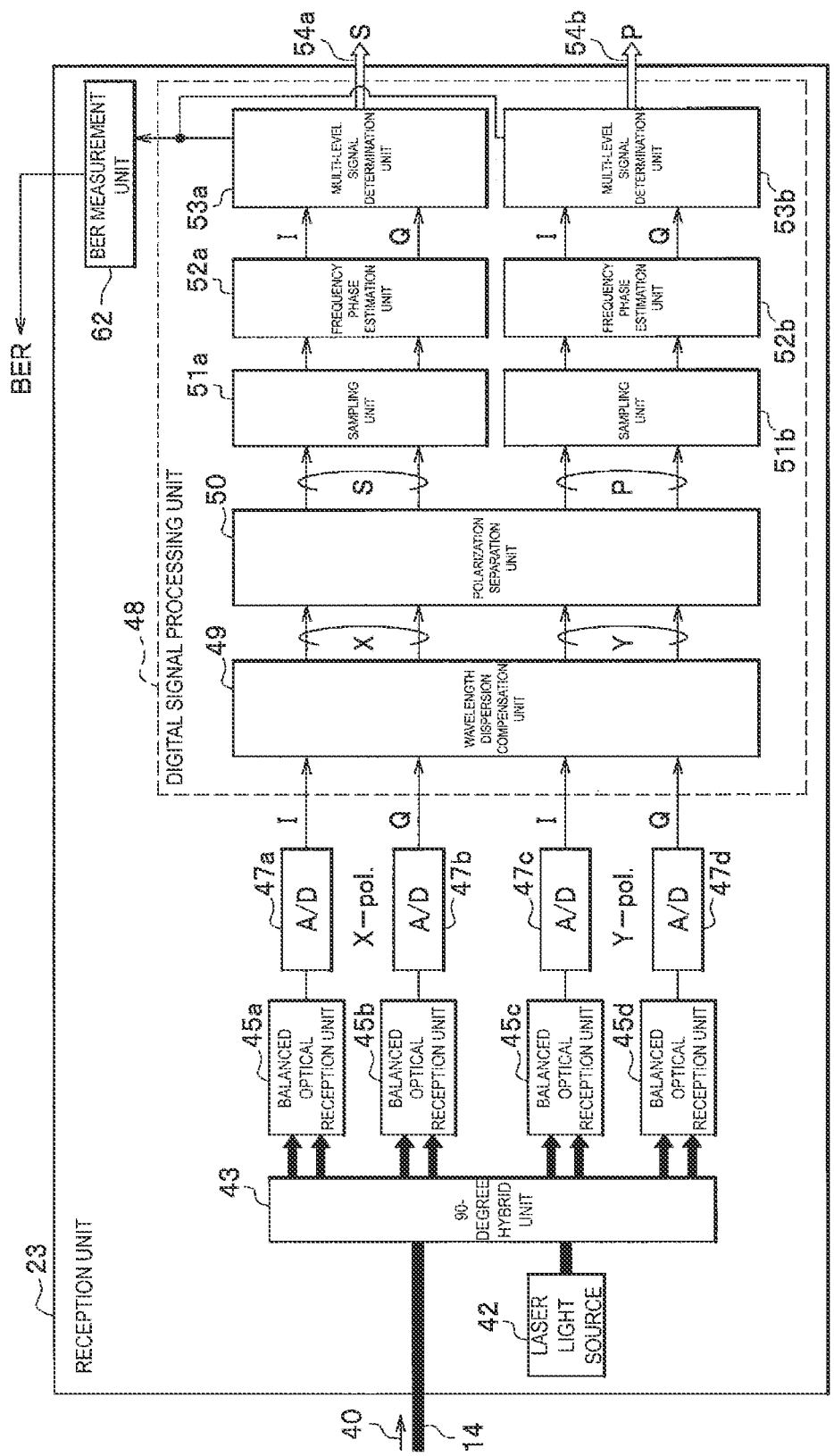
FIG. 3 is a block diagram illustrating a configuration of a reception unit of the optical transmission system according to the first embodiment.

As illustrated in FIG. 3, the reception unit 23 converts the incoming optical signal 40 transmitted through the optical fibers 14 into output information signals 54a and 54b being electric signals, and transmits the converted output information signals 54a and 54b to the communication apparatus (not illustrated). The transmission unit 22 includes a laser light source 42, a 90-degree hybrid unit 43, balanced optical reception units 45a, 45b, 45c, and 45d, analog/digital conversion units (A/Ds) 47a, 47b, 47c, and 47d, a wavelength dispersion compensation unit 49, a polarization separation unit 50, sampling units 51a and 51b, frequency phase estimation units 52a and 52b, multi-level signal determination units 53a and 53b, and a BER measurement unit 62 constituting a characteristic element of the present invention.

Note that the wavelength dispersion compensation unit 49, the polarization separation unit 50, the sampling units 51a and 51b, the frequency phase estimation units 52a and 52b, and the multi-level signal determination units 53a and 53b constitute a digital signal processing unit 48.

The transmission unit 22 illustrated in FIG. 2 branches unmodulated laser light output from the laser light source 34 into two by using the optical branch unit 35, and inputs the branching laser light to two respective quadrature modulation units 36a and 36b. As the quadrature modulation units 36a and 36b, two sets of Mach-Zehnder (MZ) modulators disposed in parallel on a substrate made of lithium niobate or the like are used. The quadrature modulation units 36a and 36b perform quadrature modulation processing. In the quadrature modulation processing, a voltage signal modulated at high speed is applied to a modulation signal input end of each MZ modulator, so that the in-phase component (I-component or a real part) and the quadrature component (Q-component or an imaginary part) in the photoelectric field are independently output from an output end thereof.

The input information signals 30a and 30b from the communication apparatus are encoded into multi-level signals, such as 16-Quadrature Amplitude Modulation (QAM) signals, by the encoder units 31a and 31b. The in-phase component and the quadrature component of the multi-level signals are converted into analog signals by the D/As 32a to 32d, and are then input into in-phase/quadrature modulation ends of the respective quadrature modulation units 36a and 36b.

As a result the above operation, signal light output from the quadrature modulation units 36a and 36b are independent multi-level modulation light that are individually modulated on the two dimensional complex plane. In other words, the signal light is input to the polarization synthesis unit 37 in the form of an S-polarization optical modulated signal 38 and a P-polarization optical modulated signal 39, which are converted so that both the polarization states are in quadrature. The signal light is polarization-synthesized by the polarization synthesis unit 37 into the optical signal 40 being a polarization multiplexed optical multi-level signal, and is output to an optical multiplexer/demultiplexer unit 12 (FIG. 1) through the optical fibers 14.

As illustrated in FIG. 1, such optical signals 40 output from respective transponder units 21a to 21n to the optical fibers 14 as described above are multiplexed by the optical multiplexer/demultiplexer unit 12, amplified in the optical amplification unit 13a, and transmitted through the optical fibers 14 to be transmitted to the receiving side. In the optical fibers 14, the transmitted optical signals 40 are subjected to add/drop processing by the optical cross connect units 15a and 15n. After being amplified in the optical amplification unit 13b on the receiving side, the optical signals 40 are demultiplexed in the optical multiplexer/demultiplexer unit 12b, and are received in respective transponder units 16a to 16n.

The optical signals 40 demultiplexed in the optical multiplexer/demultiplexer unit 12b are polarization multiplexed optical multi-level signals, and are separated into four sets of optical signals of X polarized components {in-phase/quadrature components (X-pol.)} and Y polarized components (in-phase/quadrature components (Y-pol.)) by the 90-degree hybrid unit 43 illustrated in FIG. 3, and the four sets of optical signals are output to four respective balanced optical reception units 45a to 45d.

The frequency of the laser light emitted from the laser light source 42 is set to be substantially the same as the frequency of the polarization multiplexed optical multi-level signals being the incoming optical signals 40 transmitted through the optical fibers 14. The laser light from the laser light source 42 is input through another input port of the 90-degree hybrid unit 43, and is distributed into respective balanced optical reception units 45a to 45d.

The balanced optical reception units 45a to 45d cause light from a local oscillator to interfere with the input signal light, and convert the signal light obtained through the interference into analog electric signals by using photodiodes. The electric signals are converted into digital signals (I-component, Q-component) by the A/Ds 47a to 47d, and are then output to the digital signal processing unit 48.

In the digital signal processing unit 48, first, in the wavelength dispersion compensation unit 49, components corresponding to an inverse function of wavelength dispersion resulting from the superimposition in the optical fibers 14 are applied, and waveform deterioration caused in the optical fibers 14 is thereby compensated. In the polarization separation unit 50, transmitted quadrature polarized components of the signals (X, Y) after being subjected to the deterioration compensation are detected and are then polarization-converted, and the original S-polarized component and P-polarized component on the transmitting side are thereby separately extracted.

The S-polarized component is output to the sampling unit 51a, and the P-polarized component is output to the sampling unit 51b. In the sampling units 51a and 51b, data of center time of waveforms is extracted. Next, in the frequency phase estimation units 52a and 52b, an intermediate frequency (IF) offset frequency component and a phase fluctuation component are removed, and data of the I-component and the Q-component are output. Finally, in the multi-level signal determination units 53a and 53b, the data of the I-component and the Q-component is subjected to multi-level signal determination and decoding processing, and the output information signals 54a and 54b are thereby obtained.

Note that, in general, a framer/error correction circuit is disposed at a subsequent stage of the reception unit 23. The framer/error correction circuit analyzes received signals to search for the start of a data frame, performs error correction processing on the following data of the searched start by using error correction information prepared before the transmission, reads information in the header, and performs processing for channels and monitor information, for example.

The BER measurement unit 62 refers to the output information signals 54a and 54b demodulated in the multi-level signal determination units 53a and 53b of the digital signal processing unit 48 to measure a BER, and feeds the measured BER back to the transmission units 22 of the transponder units 21a to 21n on the transmitting side.

The measured BER indicates a bit error rate of signals between the transponder units 21a to 21n on the transmitting side and the transponder units 22a to 22n on the receiving side. A high BER denotes worsening of the signal transmission state between the transponder units. Thus, in this case, feedback is performed so that the BER is lowered and the signal transmission state is enhanced.

The fed back BER is input to the frequency shift control unit 61 of each transmission unit 22 of the transponder units 21a to 21n. The control unit 61 performs control of shifting the center frequency of the laser light emitted from the laser light source 34 in accordance with the input BER to make the center frequency match the center frequency of the optical signal 40 shifted on the receiving side, thereby making both the center frequencies match each other. The matching of both the center frequencies allows for reduction of narrowing of the optical signal 40 on the receiving side.

Figure 4:
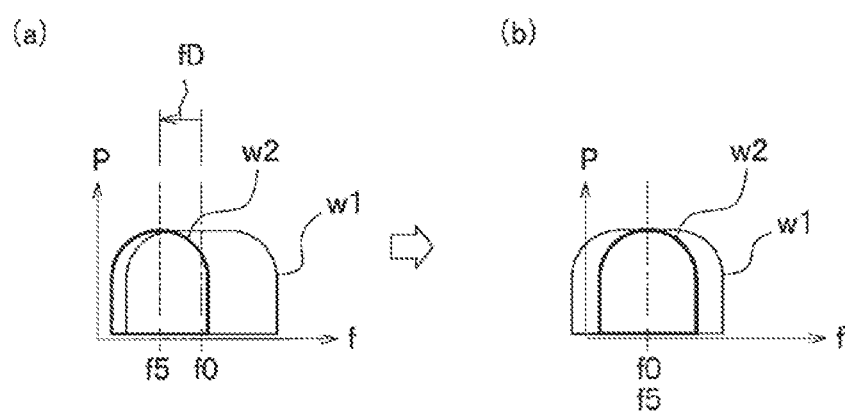
FIG. 4(a) is a diagram illustrating how a center frequency f0 of laser light on a transmitting side is caused to match a center frequency f5 of a received optical signal.
FIG. 4(b) is a diagram illustrating how a signal waveform W2 of the received optical signal falls within a band of a signal waveform W1 of the laser light on the transmitting side.

As in FIG. 4(a), the received signal in the transponder units 22a to 22n on the receiving side has a signal waveform W2 of a narrow band whose center frequency is a center frequency f5. The center frequency f5 is shifted by frequency fD from a center frequency f0 of a transmission signal having a signal waveform W1 that is transmitted from the transponder units 21a to 21n on the transmitting side. In view of this, when the center frequency f0 is shifted by the frequency fD so as to match the center frequency f5, as illustrated in FIG. 4(b), the signal waveform W2 of the received signal falls within the band of the signal waveform W1 of the transmission signal.

The laser light source 34 is manufactured in conformity with the Integrable Tunable Laser Assembly (ITLA) standards, and thus has a function of shifting the center frequency of the laser light according to the frequency shift control of the control unit 61.

Figure 5:
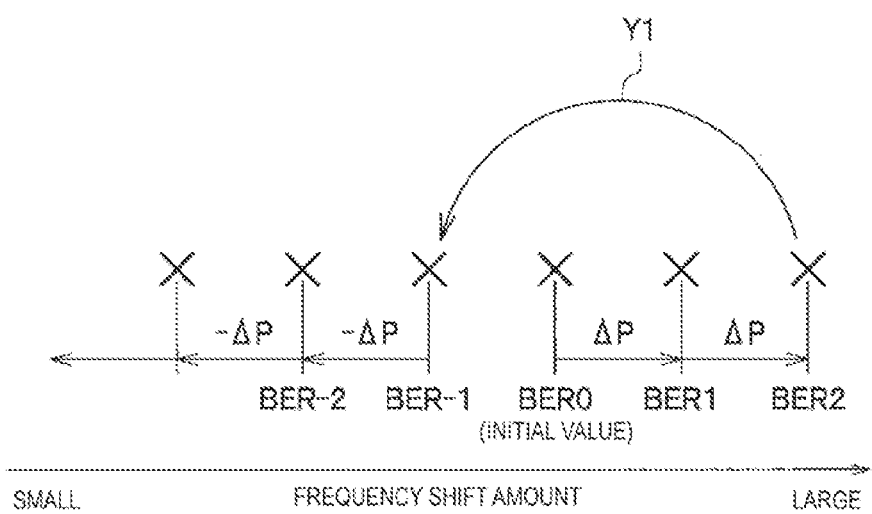
FIG. 5 is an explanatory diagram of an operation of shifting a center frequency of the laser light from a laser light source to cause the center frequency to match a center frequency of the received optical signal.

As illustrated in FIG. 5, the control unit 61 sets a value of the fed back BER as an initial value BER0. Next, the center frequency f0 of the laser light emitted from the laser light source 34 when the value is the initial value BER0 is shifted twice each by a certain amount ΔP in a direction in which the frequency shift amount is increased (frequency increase direction), for example. Shifting the center frequency f of the laser light in this manner changes incoming values of fed back BERs accordingly.

In view of this, the control unit 61 stores a BER1 that is measured and fed back by the BER measurement unit 62 on the receiving side when the center frequency f0 is shifted by ΔP in the frequency increase direction in the first shift in a storage unit (not illustrated), and also stores a BER2 that is fed back when the center frequency f0 is shifted by ΔP in the second shift in the storage unit. If values of the stored BER1 and BER2 obtained as a result of the two times of shift change to larger values, the control unit 61 determines that the signal transmission state between the transponder units has deteriorated (worsened).

After making such determination, the control unit 61 performs frequency shift control of shifting twice the center frequency f0 of the laser light from the laser light source 34 each by a certain amount −ΔP in a frequency decrease direction as indicated by the arrow Y1. The frequency decrease direction is a direction opposite to the frequency increase direction in which the center frequency 10 is previously shifted twice. After performing the control, the control unit 61 stores a BER-1 and a BER-2 that are fed back from the BER measurement unit 62 on the receiving side obtained as a result of the first and second frequency shift, respectively, in the storage unit.

If values of the stored BER-1 and BER-2 obtained as a result of the two times of frequency shift change to smaller values, the control unit 61 determines that the signal transmission state between the transponder units has enhanced. After making such determination, the control unit 61 performs control of shifting the center frequency f0 of the laser light in the frequency decrease direction so that a fed back BER is minimized. When the BER is minimized, the control unit 61 determines that the center frequency f0 of the laser light and the center frequency f5 of the optical signal 40 on the receiving side match each other, and thus stops the control.

Operation of First Embodiment

Next, the operation of reducing a filter penalty in the optical transmission system 10A according to the first embodiment will be described with reference to the flowchart of FIG. 6.

Note that, as illustrated in FIG. 1, the following optical transmission is being performed. The input information signals 30a and 30b from the communication apparatus (not illustrated) are converted into the optical signals 40 in the transmission unit 22 of each of the transponder units 21a to 21n, and these optical signals 40 are demultiplexed in the optical multiplexer/demultiplexer unit 12a and amplified in the optical amplification unit 13a to be transmitted to the optical fibers 14. The transmitted optical signals 40 are added/dropped in the optical cross connect units 15a and 15n as necessary.

Subsequently, the optical signals 40 are sequentially amplified in the optical amplification unit 13b on the receiving side and demultiplexed in the optical multiplexer/demultiplexer unit 12b. Further, the optical signals 40 are received in the transponder units 16a to 16n to be transmitted to the communication apparatus (not illustrated).

Figure 6:
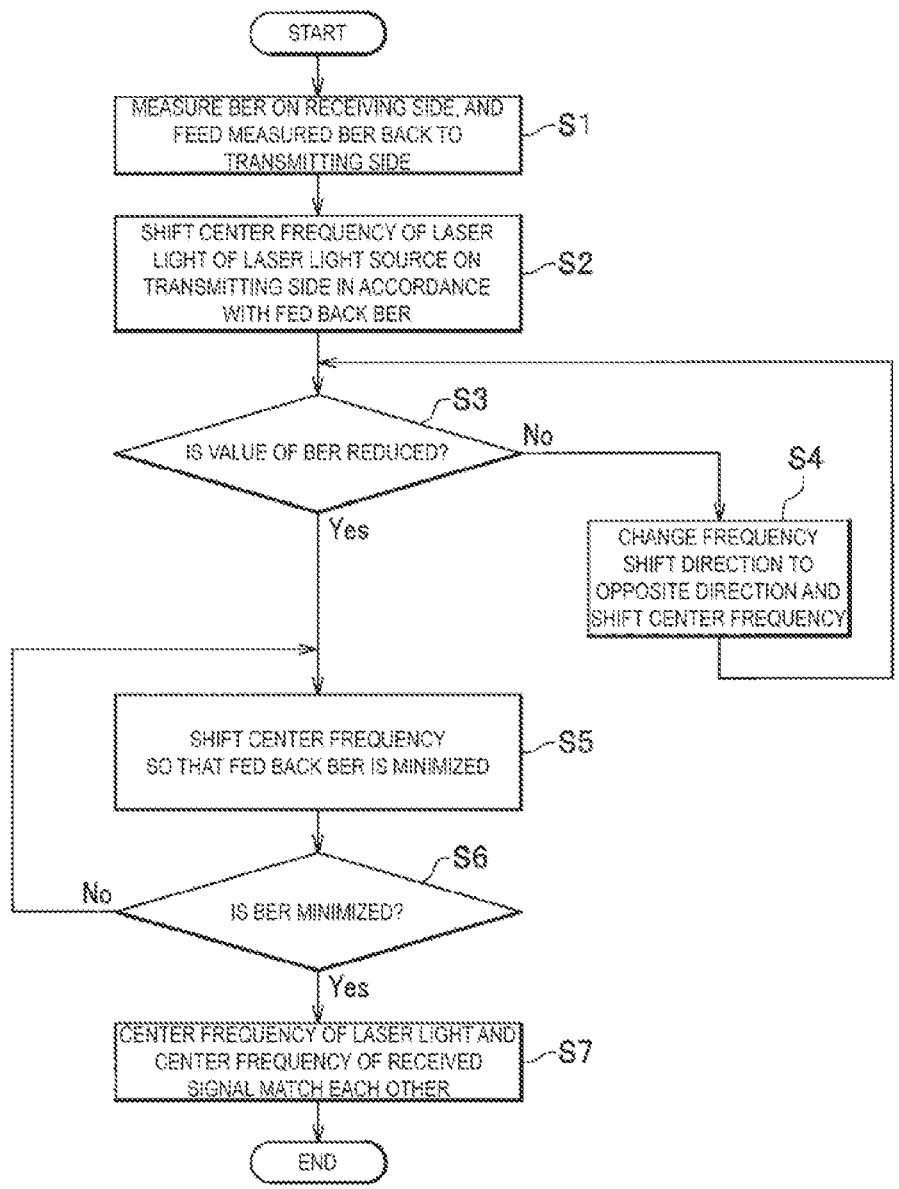
FIG. 6 is a flowchart for describing an operation of reducing a filter penalty in the optical transmission system according to the first embodiment.

During such optical transmission, in Step S illustrated in FIG. 6, the BER measurement unit 62 (FIG. 3) of the reception unit 23 in each of the transponder units 22a to 22n on the receiving side measures a BER, based on the output information signals 54a and 54b demodulated in the multi-level signal determination units 53a and 53b of the digital signal processing unit 48. The BER measurement unit 62 feeds the measured BER back to the transmission units 22 of the transponder units 21a to 21n on the transmitting side.

In Step S2, the fed back BER is input to the frequency shift control unit 61 of the transmission units 22 of the transponder units 21a to 21n on the transmitting side. The control unit 61 performs frequency shift control of shifting the center frequency f0 of the laser light emitted from the laser light source 34 in accordance with the BER so that the center frequency f0 approaches the center frequency f5 of the optical signal on the receiving side.

In Step S3, the control unit 61 determines whether or not the value of the fed back BER is reduced as a result of the frequency shift control. As a result of the determination, if the control unit 61 determines that the value is not reduced (No), i.e., determines that the value is increased, in Step S4, the control unit 61 changes the direction of frequency shift to an opposite direction and performs frequency shift control. After this control, the process returns to Step S3, and determination is performed.

As a result of the determination of Step S3, if the control unit 61 determines that the value of the fed back BER is reduced (Yes), in Step S5, the control unit 61 performs frequency shift control so that a fed back BER is minimized.

In Step S6, the control unit 61 determines whether or not the BER is minimized. If the BER is not minimized (No), the frequency shift control of Step S5 is continued.

In contrast, if the BER is minimized (Yes), in Step S7, the control unit 61 determines that the center frequency f of the laser light and the center frequency f5 of the optical signal 40 on the receiving side match each other. When the center frequencies match each other, the frequency shift control is stopped.

Effects of First Embodiment

Effects produced by the optical transmission system 10A according to the first embodiment will be described. The optical transmission system 10A includes the transponder units 21a to 21n and 22a to 22n on the transmitting side and the receiving side that respectively perform transmission and reception of the optical signal through the optical fibers 14 in which the optical filters having the multiplexing/demultiplexing function of the optical signal are interposed. The transponder units 21a to 21n and 22a to 22n each include the transmission unit 22 that transmits the optical signal obtained by modulating the laser light emitted from the laser light source 34 with the electric signal from the communication apparatus to the optical fibers 14, and the reception unit 23 that receives the optical signal from the transmission unit 22 through the optical fibers 14 and converts the received optical signal into the electric signal. Features of the first embodiment will be described.

The reception unit 23 includes the BER measurement unit 62 that measures the BER, based on the received signal of the transponder units 22a to 22n on the receiving side, and feeds the measured BER back to the transponder units 21a to 21n on the transmitting side. The transmission unit 22 includes the frequency shift control unit 61 that performs the frequency shift control of shifting the center frequency f0 of the laser light emitted from the laser light source 34 in accordance with the fed back BER so that the center frequency f0 approaches the center frequency f5 of the optical signal 40 received in the transponder units 22a to 22n on the receiving side. The control unit 61 performs the frequency shift control so that the value of the fed back BER is minimized.

According to the configuration, when the value of the BER fed back to the transmitting side is minimized as a result of the frequency shift control, the center frequency f0 of the laser light matches the center frequency f5 of the optical signal shifted on the receiving side. The matching allows for prevention of frequency shift of the optical signals caused by the optical filters in the optical fibers 14. As a result, narrowing of the optical signals 40 is reduced on the receiving side. Accordingly, in the optical fibers 14 on the receiving side, a filter penalty causing deterioration in quality of received signals can be reduced.

In addition, the optical transmission system 10A may include a forward error correction (FEC) measurement unit that measures the number of correction bits of FEC and feeds the measured number of correction bits back to the transmitting side, instead of the BER measurement unit 62 on the receiving side.

In this case, the control unit 61 on the transmitting side performs frequency shift control of shifting the center frequency f0 of the laser light emitted from the laser light source 34 so that the center frequency f0 approaches the center frequency f5 of the optical signal 40 received in the transponder units 22a to 22n on the receiving side, in such a manner that the fed back number of correction bits is minimized.

Configuration of Second Embodiment

Figure 7:
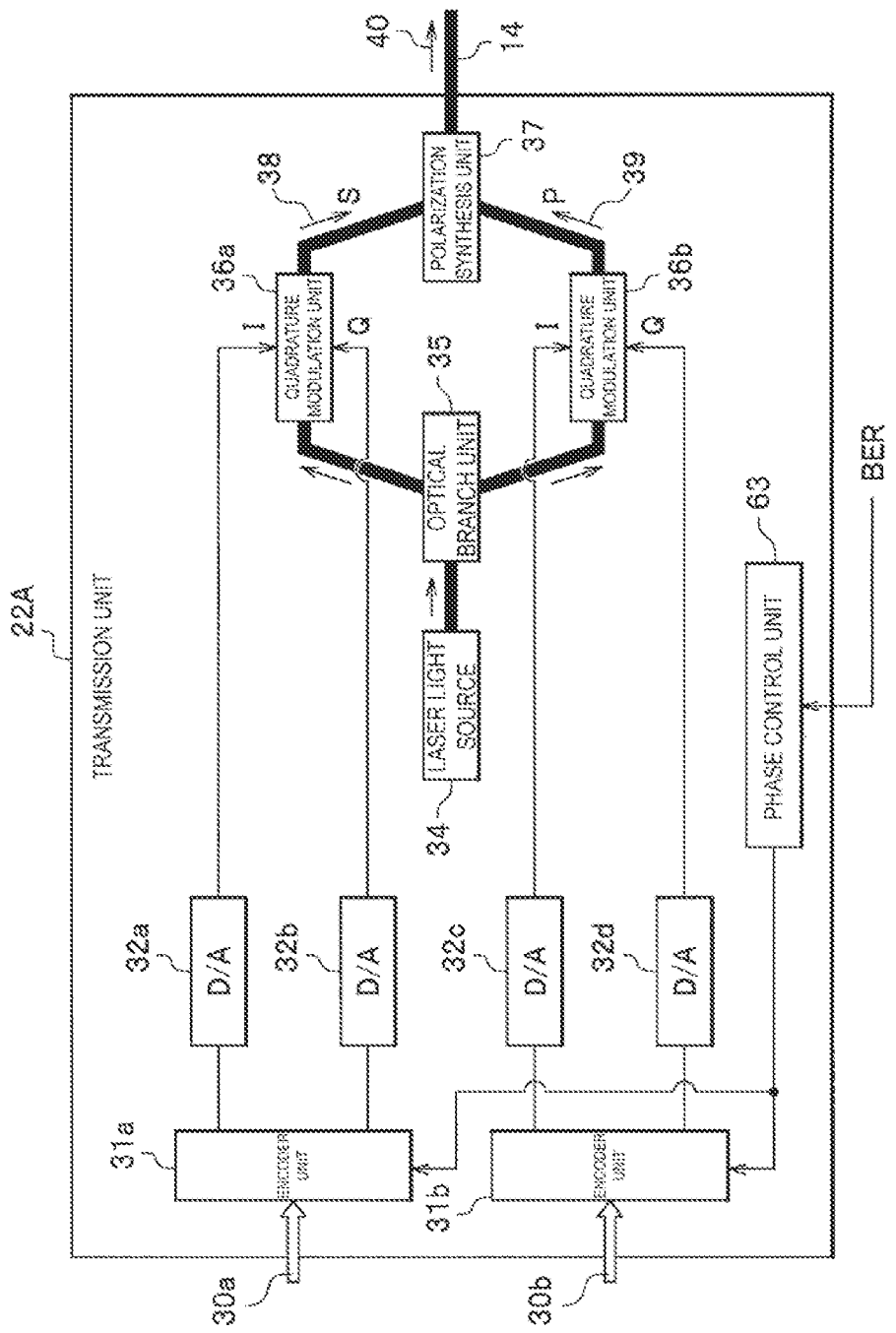
FIG. 7 is a block diagram illustrating a configuration of a transmission unit of a transponder unit in an optical transmission system according to a second embodiment of the present invention.

FIG. 7 is a block diagram illustrating a configuration of a transmission unit 22A of a transponder unit in an optical transmission system according to a second embodiment of the present invention. Note that the reception unit 23 (FIG. 3) has the same configuration as that in the first embodiment.

The transmission unit 22A illustrated in FIG. 7 is different from the transmission unit 22 (FIG. 2) according to the first embodiment in that the transmission unit 22A includes a phase control unit 63 that receives input of the fed back BER.

The phase control unit 63 performs variable phase control of causing phase of multi-level signals encoded in the encoder units 31a and 31b, such as 16-QAM signals, to be advanced or delayed, in accordance with an input BER. Note that to cause phase to be advanced is said to advance phase and to cause phase to be delayed is said to delay phase. The multi-level signals in the advanced phase state or the delayed phase state as a result of the variable phase control are converted into analog signals by the D/As 32a to 32d, and are then input to the in-phase/quadrature modulation end of the quadrature modulation units 36a and 36b.

Regarding signal light obtained by performing quadrature modulation on the laser light with the multi-level signals in the quadrature modulation units 36a and 36b, if signals with phase of the multi-level signals being advanced are used, the center frequency f of the laser light being a component of the signal light shifts in the frequency increase direction. In contrast, if signals with phase of the multi-level signals being delayed are used, the center frequency f0 of the laser light being a component of the signal light shifts in the frequency decrease direction.

According to the shift of the center frequency f as described above, values of measured BERs in the BER measurement unit 62 on the receiving side are changed. For example, when the center frequency f0 shifts in the frequency increase direction, the value of the BER is increased. In this case, the phase control unit 63 determines that the signal transmission state between the transponder units has been deteriorated (worsened).

When the phase control unit 63 makes such determination, the phase control unit 63 performs variable phase control of delaying phase of the multi-level signals of the encoder units 31a and 31b in accordance with the BER. As a result of the variable phase control, the center frequency fb shifts in the frequency decrease direction, and the value of the BER is thus reduced. In this case, the phase control unit 63 determines that the signal transmission state between the transponder units has been enhanced.

After the phase control unit 63 makes the determination of the enhancement, the phase control unit 63 performs variable phase control of delaying phase of the multi-level signals of the encoder units 31a and 31b so that a fed back BER is minimized. When the BER is minimized, the phase control unit 63 determines that the center frequency f0 of the laser light and the center frequency f5 of the optical signals 40 on the receiving side match each other, and thus stops the control.

According to the transmission unit 22A of the second embodiment having a configuration as described above, when the value of the BER fed back to the transmitting side is minimized as a result of the variable phase control, the center frequency f0 of the laser light matches the center frequency f5 of the optical signal shifted on the receiving side. As a result, narrowing of the optical signal 40 on the receiving side is reduced. Accordingly, in the optical fibers 14 on the receiving side, a filter penalty causing deterioration in quality of received signals is reduced.

In addition, in a similar manner to the first embodiment, instead of the BER measurement unit 62 on the receiving side, an FEC measurement unit may be included, and the phase control unit 63 may perform the frequency shift control on the laser light emitted from the laser light source 34 so that the fed back number of correction bits is minimized.

Configuration of Third Embodiment

Figure 8:
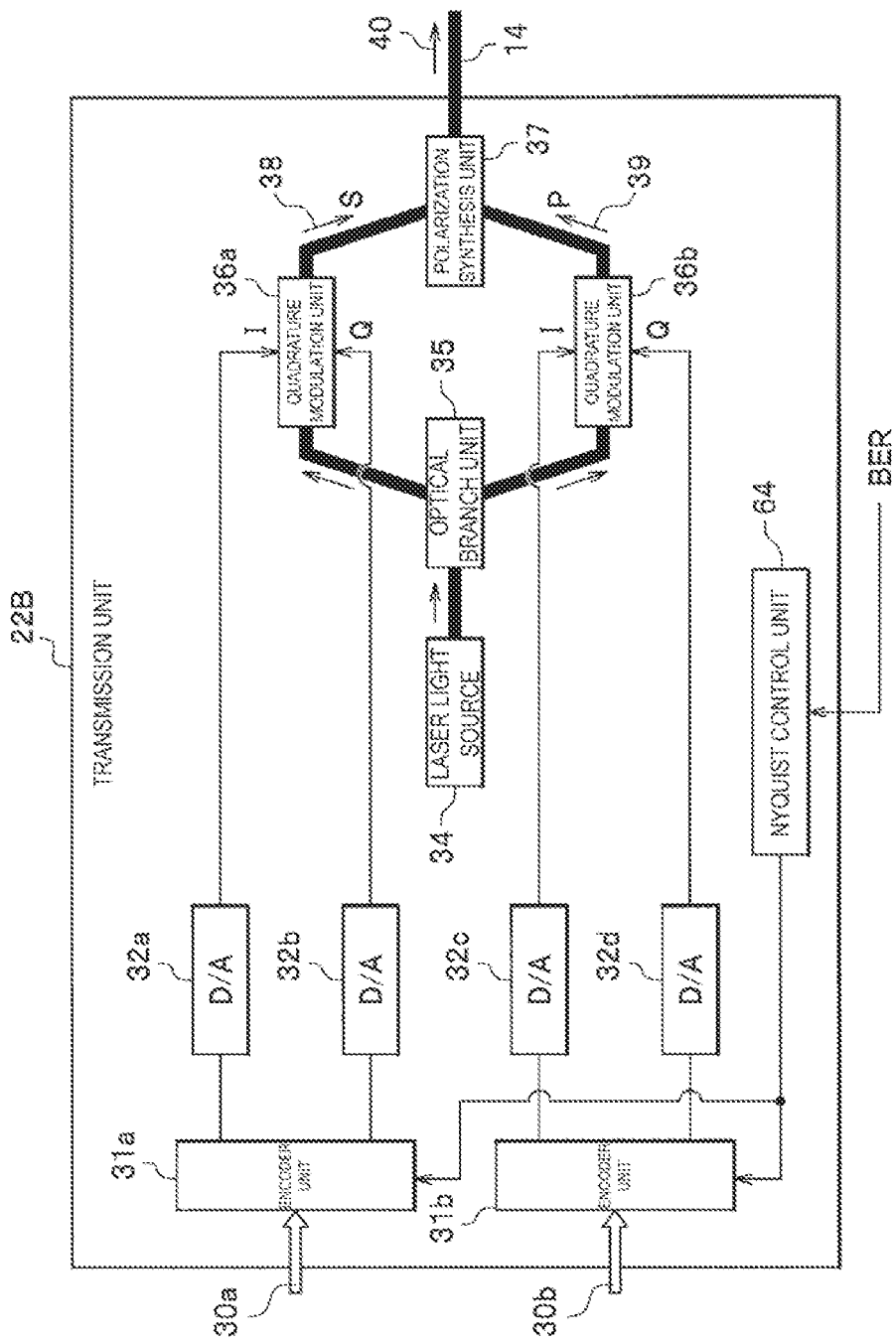
FIG. 8 is a block diagram illustrating a configuration of a transmission unit of a transponder unit in an optical transmission system according to a third embodiment of the present invention.

FIG. 8 is a block diagram illustrating a configuration of a transmission unit 22B of a transponder unit in an optical transmission system according to a third embodiment of the present invention. Note that the reception unit 23 has the same configuration as that illustrated in FIG. 3.

The transmission unit 22B illustrated in FIG. 8 is different from the transmission unit 22A (FIG. 7) according to the second embodiment in that the transmission unit 22B includes a Nyquist control unit 64 that receives input of the fed back BER, instead of the phase control unit 63. Note that the encoder units 31a and 31b each include a Nyquist filter (or a roll-off filter) being a frequency filter so as to perform encoding processing to obtain multi-level signals by using a digital signal processing function.

The Nyquist control unit 64 determines a parameter of the Nyquist filter, which is referred to as a roll-off rate, in accordance with the fed back BER so that a signal spectrum passing through the Nyquist filter of the encoder units 31a and 31b has a Nyquist form (described later), and variably sets cutoff characteristics of the Nyquist filter by using the parameter.

In other words, the Nyquist control unit 64 performs Nyquist control on the Nyquist filter so that the fed back BER is minimized. The Nyquist control is control of making a signal spectrum of the input information signals 30a and 30b passing through the Nyquist filter of the encoder units 31a and 31b have a Nyquist form, in which the rectangular waveform due to the cutoff characteristics of a signal includes a larger number of main signal components.

The Nyquist form is such a form that cutoff characteristics of a signal have a steep rectangular shape, and a larger number of main signal components are included in a narrow band including the center frequency of such a rectangular shape. Including a large number of main signal components in a narrow band as described above allows the Nyquist form to maintain the main signal components even under the influence of narrowing due to optical filters having the optical multiplexing/demultiplexing function in the optical fibers 14. As a result, deterioration in signal quality can be prevented. In other words, a filter penalty can be reduced.

In addition, in a similar manner to the second embodiment, instead of the BER measurement unit 62 on the receiving side, an FEC measurement unit may be included, and the Nyquist control unit 64 may perform the Nyquist control so that the fed back number of correction bits is minimized.

Configuration of Fourth Embodiment

Figure 9:
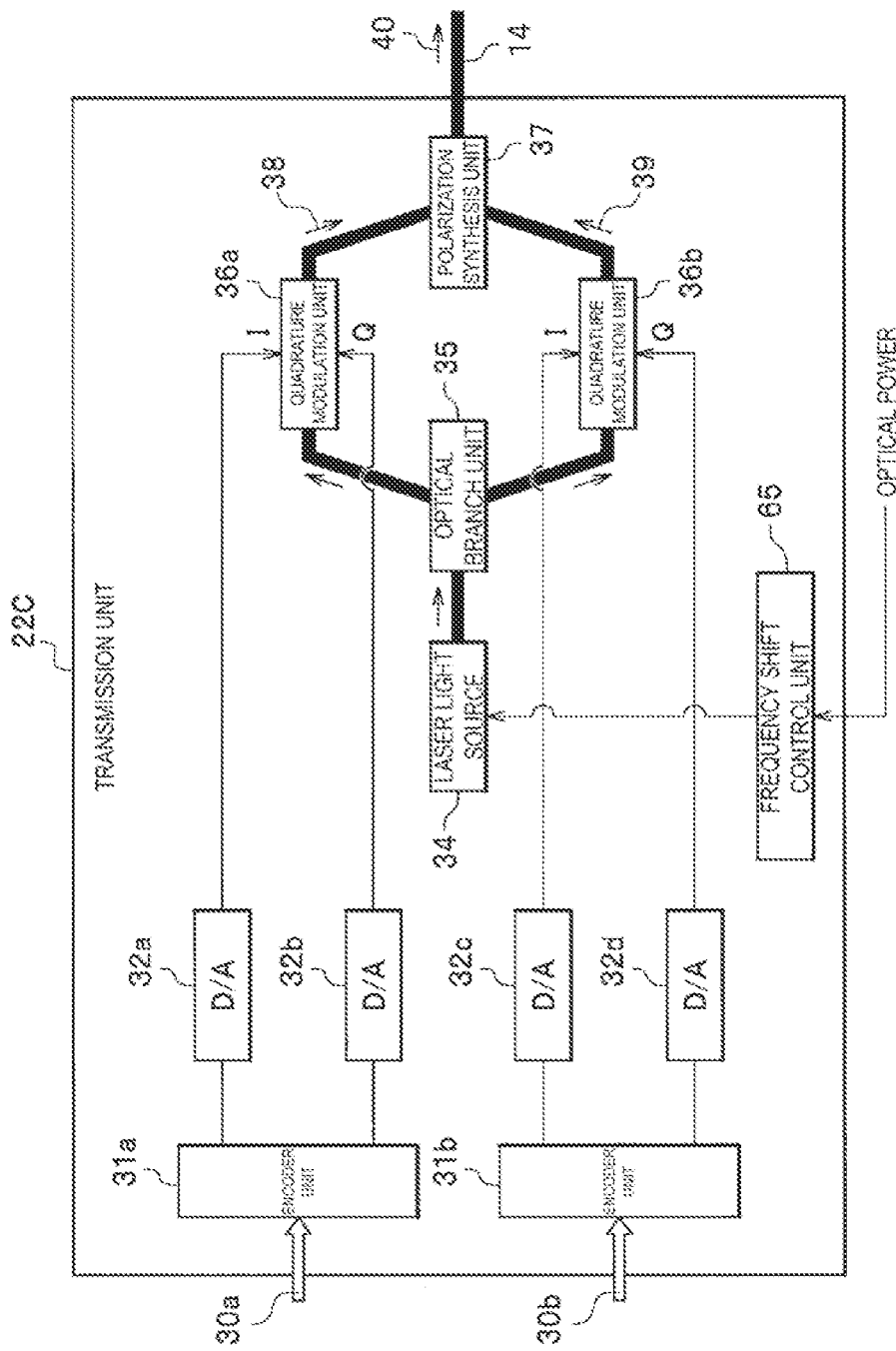
FIG. 9 is a block diagram illustrating a configuration of a transmission unit of a transponder unit in an optical transmission system according to a fourth embodiment of the present invention.
Figure 10:
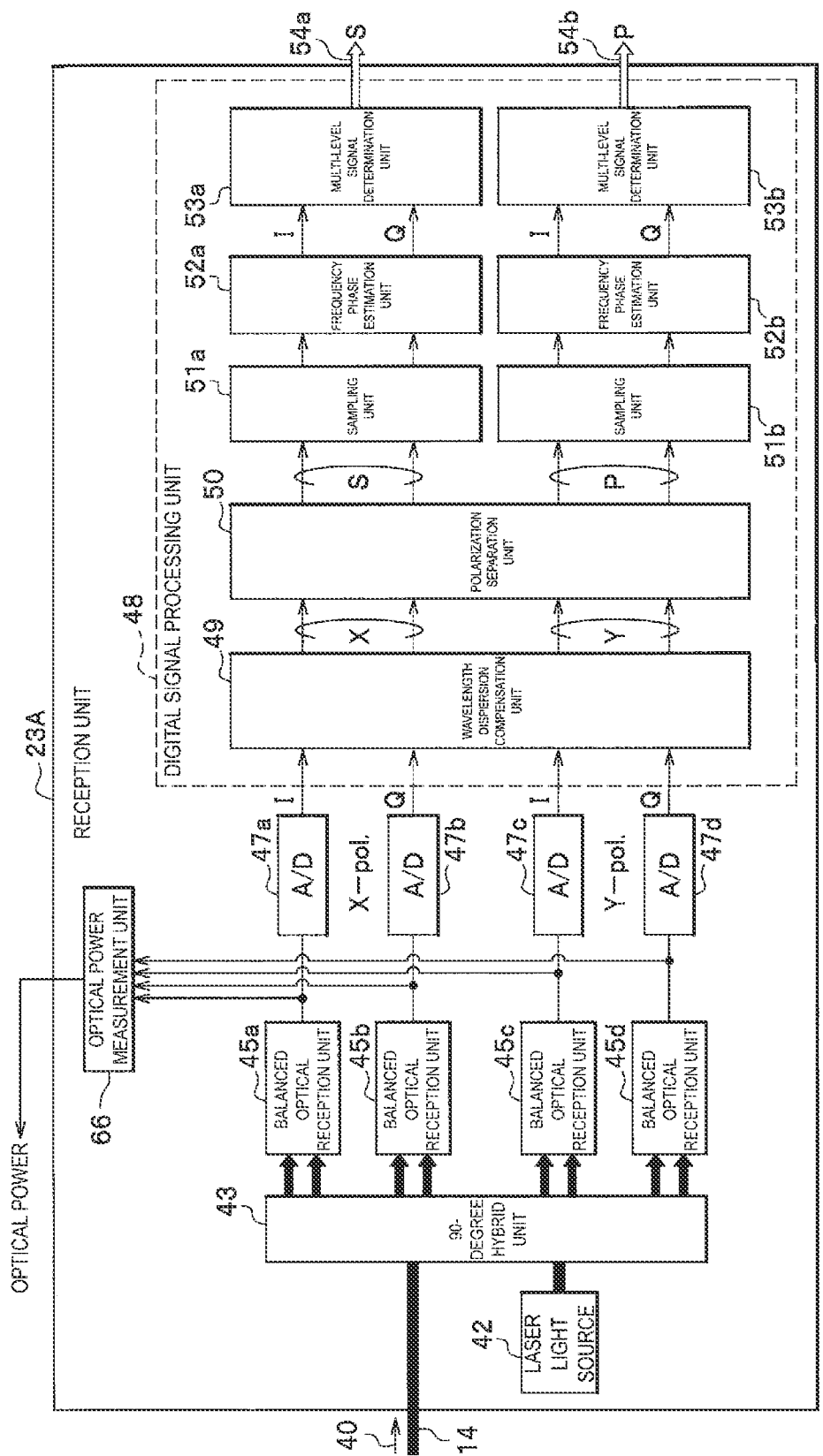
FIG. 10 is a block diagram illustrating a configuration of a reception unit of the transponder unit in the optical transmission system according to the fourth embodiment of the present invention.

FIG. 9 is a block diagram illustrating a configuration of a transmission unit 22C of a transponder unit in an optical transmission system according to a fourth embodiment of the present invention. FIG. 10 is a block diagram illustrating a configuration of a reception unit of the transponder unit in the optical transmission system according to the fourth embodiment.

The transmission unit 22C illustrated in FIG. 9 is different from the transmission unit 22 (FIG. 2) according to the first embodiment in that the transmission unit 22C includes a frequency shift control unit 65 (also referred to as a control unit 65) that receives input of optical power (see FIG. 1) fed back from the transponder units 22a to 22n on the receiving side, instead of the frequency shift control unit 61 (FIG. 2) that receives input of fed back optical power.

The reception unit 23A illustrated in FIG. 10 is different from the reception unit 23 (FIG. 3) according to the first embodiment in that the reception unit 23A includes an optical power measurement unit 66, instead of the BER measurement unit 62. The optical power measurement unit 66 measures optical power of received signals being electric signals obtained by converting the signal light in the balanced optical reception units 45a to 45d, and feeds the optical power back to the frequency shift control unit 65 in the transmission units 22C of the transponder units 21a to 21n on the transmitting side. Note that, when the balanced optical reception units 45a to 45d convert the signal light into electric signals, the balanced optical reception units 45a to 45d perform the conversion by using photodiodes as described above.

Regarding the optical power measured in the optical power measurement unit 66, small optical power denotes worsening of the signal transmission state between the transponder units. Thus, in this case, feedback is performed so that the optical power is increased and the signal transmission state is enhanced. In this case, when the optical power is maximized, the signal transmission state is most enhanced.

The fed back optical power is input to the frequency shift control unit 65 on the transmitting side. The control unit 65 performs frequency shift control of shifting (as in FIG. 4(a)) the center frequency f of the laser light emitted from the laser light source 34 to make the center frequency f0 match the center frequency f5 of the optical signal 40 shifted on the receiving side, thereby making both the center frequencies match each other, so that the input optical power is maximized.

According to the configuration, when the optical power fed back to the transmitting side is maximized as a result of the frequency shift control, the center frequency f0 of the laser light matches the center frequency f5 of the optical signal shifted on the receiving side. The matching allows for prevention of frequency shift of the optical signals caused by the optical filters in the optical fibers 14. As a result, narrowing of the optical signals 40 is reduced on the receiving side, and a filter penalty causing deterioration in quality of received signals can be thereby reduced.

Further, the measurement of the optical power requires only measurement of optical power itself received in the photodiodes. As a result, implementation can be achieved with a simple configuration. In addition, light is used in the control. As a result, high speed control can be implemented.

Configuration of Fifth Embodiment

Figure 11:
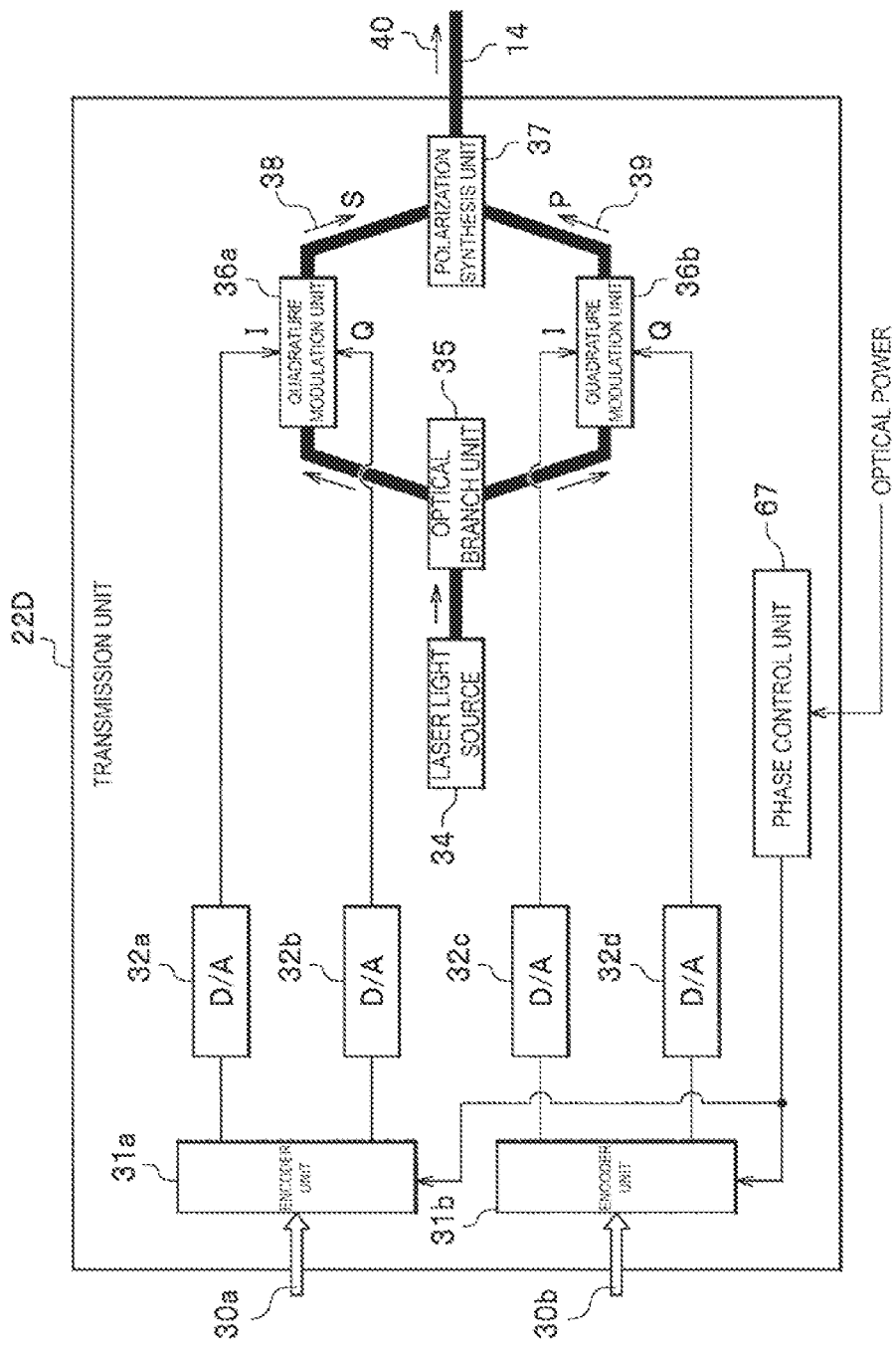
FIG. 11 is a block diagram illustrating a configuration of a transmission unit of a transponder unit in an optical transmission system according to a fifth embodiment of the present invention.

FIG. 11 is a block diagram illustrating a configuration of a transmission unit 22D of a transponder unit in an optical transmission system according to a fifth embodiment of the present invention. Note that the reception unit 23A (FIG. 10) has the same configuration as that in the fourth embodiment.

The transmission unit 22D illustrated in FIG. 11 is different from the transmission unit 22C (FIG. 9) according to the fourth embodiment in that the transmission unit 22D includes a phase control unit 67 that receives input of the fed back optical power.

The phase control unit 67 performs variable phase control of causing phase of multi-level signals encoded in the encoder units 31a and 31b, such as 16-QAM signals, to be advanced or delayed, in accordance with input optical power. The multi-level signals whose phase is in the advanced phase state or the delayed phase state as a result of the variable phase control are converted into analog signals by the D/As 32a to 32d, and are then input to the in-phase/quadrature modulation end of the quadrature modulation units 36a and 36b.

Regarding signal light obtained by performing quadrature modulation on the laser light with the multi-level signals in the quadrature modulation units 36a and 36b, if the multi-level signals are signals in the advanced phase state, the center frequency f0 of the laser light being a component of the signal light shifts in the frequency increase direction. In contrast, if the multi-level signals are signals in the delayed phase state, the center frequency f0 of the laser light being a component of the signal light shifts in the frequency decrease direction.

According to the shift of the center frequency f as described above, values of optical power measured in the optical power measurement unit 66 on the receiving side are changed. For example, when the center frequency f0 shifts in the frequency increase direction, the value of the optical power is reduced. In this case, the phase control unit 67 determines that the signal transmission state between the transponder units has been deteriorated (worsened).

When the phase control unit 67 makes such determination, the phase control unit 67 performs variable phase control of delaying phase of the multi-level signals of the encoder units 31a and 31b in accordance with the optical power. As a result of the variable phase control, the center frequency f0 shifts in the frequency decrease direction, and the optical power is thus reduced. In this case, the phase control unit 67 determines that the signal transmission state between the transponder units has been enhanced.

After the phase control unit 67 makes the determination, the phase control unit 67 performs variable phase control of delaying phase of the multi-level signals of the encoder units 31a and 31b so that fed back optical power is maximized. When the optical power is maximized, the phase control unit 67 determines that the center frequency f0 of the laser light and the center frequency f5 of the optical signals 40 on the receiving side match each other, and thus stops the control.

According to the transmission unit 22D of the fifth embodiment having a configuration as described above, when the value of the optical power fed back to the transmitting side is maximized as a result of the variable phase control, the center frequency f0 of the laser light matches the center frequency f5 of the optical signal shifted on the receiving side. As a result, narrowing of the optical signal 40 on the receiving side is reduced. Accordingly, in the optical fibers 14 on the receiving side, a filter penalty causing deterioration in quality of received signals can be reduced.

Configuration of Sixth Embodiment

Figure 12:
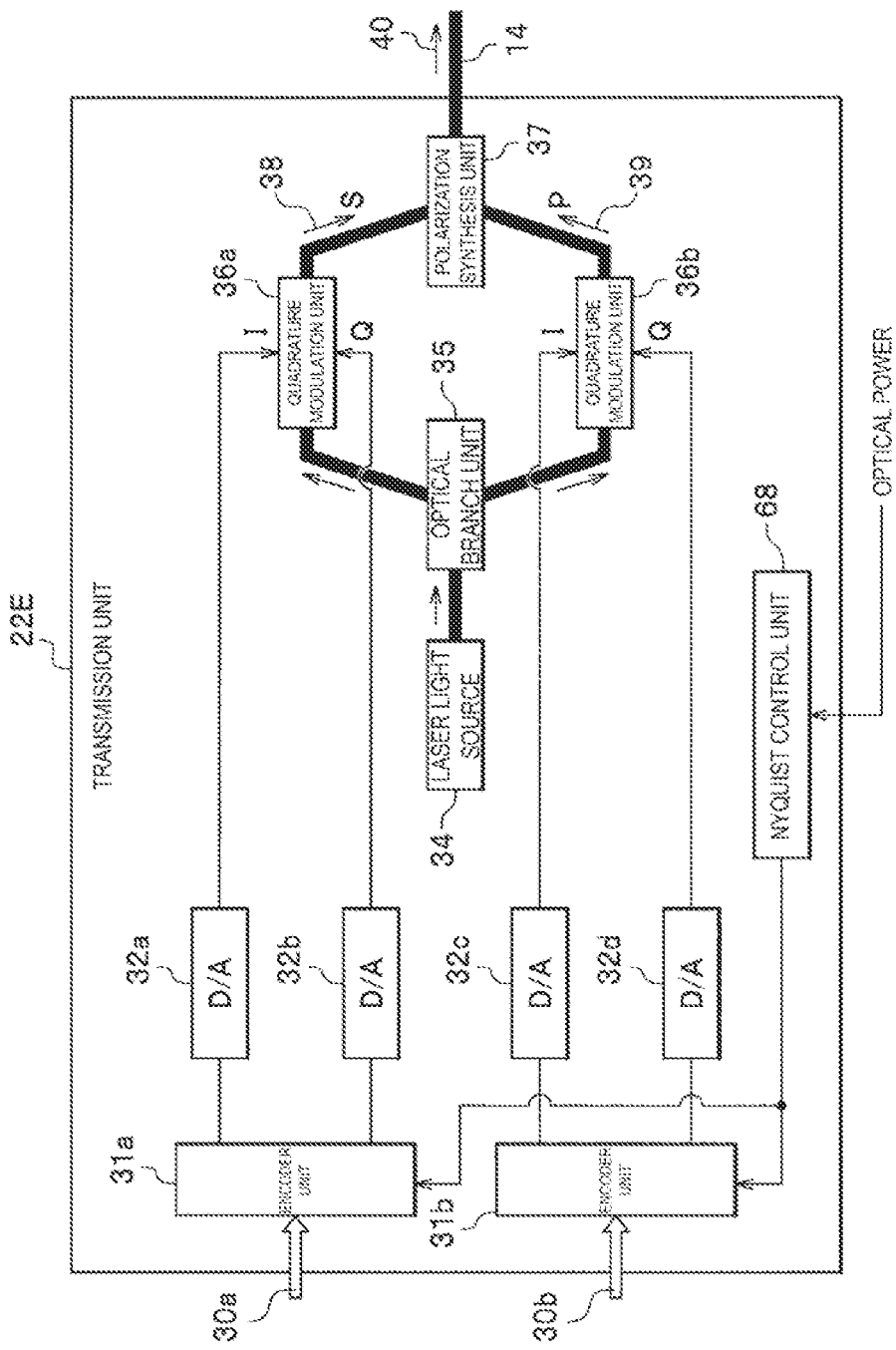
FIG. 12 is a block diagram illustrating a configuration of a transmission unit of a transponder unit in an optical transmission system according to a sixth embodiment of the present invention.

FIG. 12 is a block diagram illustrating a configuration of a transmission unit 22E of a transponder unit in an optical transmission system according to a sixth embodiment of the present invention. Note that the reception unit 23A (FIG. 10) has the same configuration as that in the fourth embodiment.

The transmission unit 22E illustrated in FIG. 12 is different from the transmission unit 22D (FIG. 11) according to the fifth embodiment in that the transmission unit 22E includes a Nyquist control unit 68 that receives input of the fed back optical power, instead of the phase control unit 67. Note that the encoder units 31a and 31b each include a Nyquist filter (or a roll-off filter) being a frequency filter so as to perform encoding processing to obtain multi-level signals by using a digital signal processing function.

The Nyquist control unit 68 determines a parameter of the Nyquist filter, which is referred to as a roll-off rate, in accordance with the fed back optical power so that a signal spectrum passing through the Nyquist filter of the encoder units 31a and 31b has a Nyquist form, and variably sets cutoff characteristics of the Nyquist filter by using the parameter.

In other words, the Nyquist control unit 68 performs Nyquist control on the Nyquist filter so that the fed back optical power is maximized. The Nyquist control is control of making a signal spectrum of the input information signals 30a and 30b passing through the Nyquist filter of the encoder units 31a and 31b have a Nyquist form, in which the rectangular waveform due to the cutoff characteristics of a signal includes a larger number of main signal components.

According to the sixth embodiment having a configuration as described above, making a signal spectrum passing through the Nyquist filter have a Nyquist form including a larger number of main signal components allows for maintenance of the main signal components even under the influence of narrowing due to optical filters having the optical multiplexing/demultiplexing function in the optical fibers 14. As a result, deterioration in signal quality can be prevented. In other words, a filter penalty can be reduced.

Configuration of Seventh Embodiment

Figure 13:
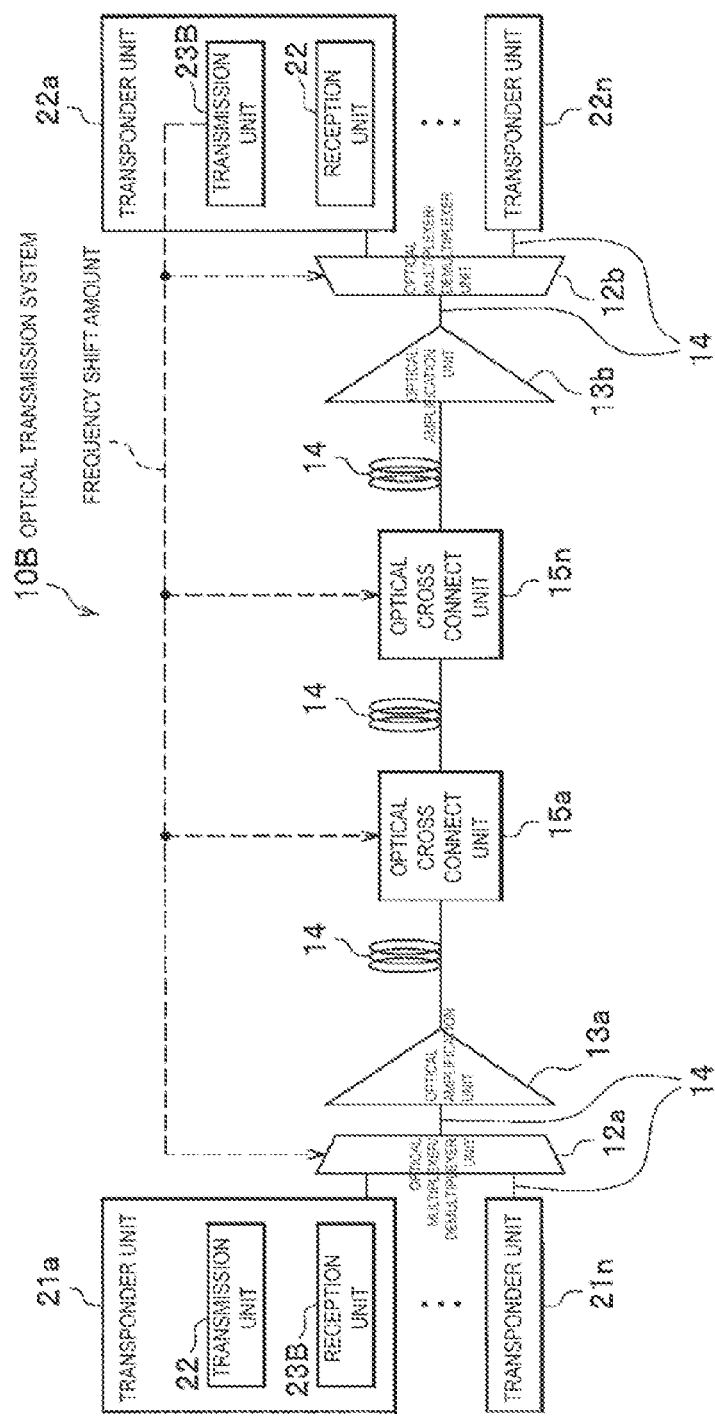
FIG. 13 is a block diagram illustrating a configuration of an optical transmission system according to a seventh embodiment of the present invention.

FIG. 13 is a block diagram illustrating a configuration of an optical transmission system 10B according to a seventh embodiment of the present invention.

The optical transmission system 10B illustrated in FIG. 13 is different from the optical transmission system 10A (FIG. 1) according to the first embodiment in that the following control is performed in the optical transmission system 10B. In the control, the frequency shift amount is determined in the reception units 23B of the transponder units 22a to 22n on the receiving side while measuring the optical power of the received optical signals, and the center frequency of the optical filters of the intermediate units (the optical multiplexer/demultiplexer units 12a and 12b and the optical cross connect units 15a and 15n) is caused to match the center frequency of the laser light on the transmitting side by using the frequency shift amount.

Note that the optical multiplexer/demultiplexer units 12a and 12b being the intermediate units include an arrayed waveguide grating (AWG) being an optical device. The AWG is such an optical filter that performs multiplexing/demultiplexing using the wavelength by causing interference in light that has propagated in a large number of waveguides having different optical path lengths. The AWG performs control of separating frequencies by variably changing temperatures, and is thus capable of frequency shift.

Further, the optical cross connect units 15a and 15n being the intermediate units are wavelength selective switches (WSSs) capable of frequency shift.

Figure 14:
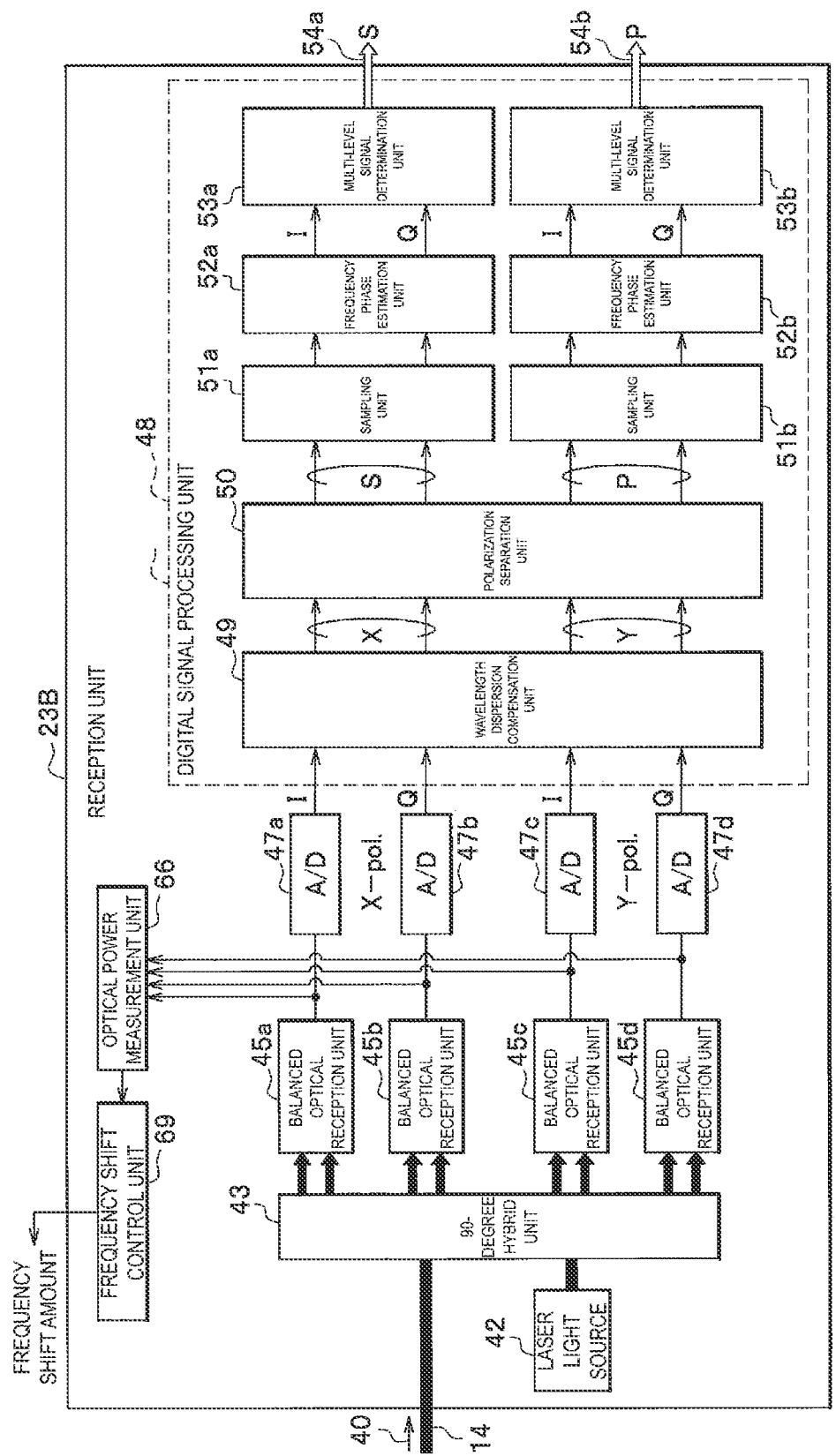
FIG. 14 is a block diagram illustrating a configuration of a reception unit of a transponder unit in the optical transmission system according to the seventh embodiment.

The reception unit 23B illustrated in FIG. 14 is different from the reception unit 23A illustrated in FIG. 10 in that the reception unit 23B includes a frequency shift control unit 69 (also referred to as a control unit 69), in addition to the optical power measurement unit 66 (FIG. 10). The control unit 69 determines the frequency shift amount by which the center frequency of the optical signals of the intermediate units is shifted so that the optical power measured in the optical power measurement unit 66 is maximized, and outputs the determined frequency shift amount to the intermediate units.

In the optical multiplexer/demultiplexer units 12a and 12b being the intermediate units, the center frequency of the optical signals in the AWGs is shifted according to the frequency shift amount, and in the optical cross connect units 15a and 15n, the center frequency of the optical signals in the WSSs is shifted. When the center frequency of the optical signals shifted on the receiving side and the center frequency of the laser light on the transmitting side match each other as a result of the shift, the optical power measured in the optical power measurement unit 66 is maximized.

According to the configuration of the seventh embodiment having a configuration as described above, the frequency shift amount is determined while measuring the optical power of the received optical signals, and the center frequency of the optical filters in the intermediate units in the optical fibers 14 is shifted by the frequency shift amount. When the measured optical power is maximized as a result of the shift, the center frequency f0 of the laser light and the center frequency f5 of the optical signal shifted on the receiving side match each other. As a result, narrowing of the optical signal 40 on the receiving side is reduced. Accordingly, in the optical fibers 14 on the receiving side, a filter penalty causing deterioration in quality of received signals can be reduced.

In addition, examples of types of the optical cross connect units 15a and 15n being the intermediate units include one using a liquid crystal on silicon (LCOS), which is a spatial optical modulator using liquid crystals inside the WSS.

When such a type of WSS is used as the optical cross connect units 15a and 15n, the frequency shift amount transmitted from the frequency shift control unit 69 may be input to the LCOS so that the center frequency of the optical filters is shifted.

In addition, a specific configuration can be changed as appropriate without departing from the spirit of the present invention. Further, although the above embodiments describe an example in which the present invention is applied to multi-level signals, the present invention can also be applied to binary amplitude modulation, phase modulation, and encoding modulation, for example.

REFERENCE SIGNS LIST 10A, 10B Optical transmission system
12a, 12b Optical multiplexer/demultiplexer unit
13a, 13b Optical amplification unit
15a, 15n Optical cross connect unit
21a-21n, 22a-22n Transponder unit
22, 22A, 22B, 22C, 22D, 22E Transmission unit
23, 23A, 23B Reception unit
61, 65, 67 Frequency shift control unit
62 BER measurement unit
63 Phase control unit
64, 68, 69 Nyquist control unit
66 Optical power measurement unit

The invention claimed is:

1. An optical transmission system comprising a first transponder unit, including one or more processors, on a transmitting side and a second transponder unit, including one or more processors, on a receiving side, configured to perform transmission and reception of an optical signal through an optical transmission line in which an optical filter having a multiplexing/demultiplexing function of the optical signal is interposed, the first transponder unit on the transmitting side and the second transponder unit on the receiving side each including a respective transmission unit and a respective reception unit, the transmission unit of the first transponder unit configured to transmit the optical signal that has been generated by modulating laser light emitted from a laser light source with an electric signal from a communication apparatus to the optical transmission line, the reception unit of the second transponder unit configured to receive the optical signal from the transmission unit of the first transponder unit through the optical transmission line and convert the received optical signal into an electric signal, wherein the reception unit of the second transponder unit includes a bit error rate (BER) measurement unit, including one or more processors, configured to measure a BER, based on a received signal of the second transponder unit on the receiving side, and feed the measured BER back to the first transponder unit on the transmitting side, the transmission unit of the first transponder unit includes a control unit, including one or more processors, configured to perform frequency shift control of shifting a center frequency of the laser light emitted from the laser light source in accordance with the fed back BER so that the center frequency approaches a center frequency of the optical signal received in the second transponder unit on the receiving side, and the control unit is configured to perform the frequency shift control so that a value of the fed back BER is minimized, wherein minimizing the value of the fed back BER comprises repeatedly shifting the center frequency of the laser light and measuring and recording the corresponding feedback BER until a minimal fed back BER is reached.

2. The optical transmission system according to claim 1, wherein the transmission unit of the first transponder unit includes an encoder unit, including one or more processors, configured to encode the electric signal from the communication apparatus into a multi-level signal, a digital/analog conversion unit, including one or more processors, configured to convert the multi-level signal output from the encoder unit into a digital signal, a quadrature modulation unit, including one or more processors, configured to output signal light obtained by performing quadrature modulation on the laser light with the multi-level signal being the converted digital signal, and a phase control unit, including one or more processors, configured to perform variable phase control of causing phase of the multi-level signal from the encoder unit to be advanced or delayed, in accordance with the fed back BER.

3. The optical transmission system according to claim 1, wherein the transmission unit includes an encoder unit, including one or more processors, configured to encode the electric signal from the communication apparatus into a multi-level signal, the encoder unit including a frequency filter related to the encoding, and a Nyquist control unit, including one or more processors, configured to perform Nyquist control on the frequency filter in accordance with the fed back BER, the Nyquist control being control of making a signal spectrum of the electric signal from the communication apparatus passing through the frequency filter have a Nyquist form.

4. An optical transmission system comprising a first transponder unit, including one or more processors, on a transmitting side and a second transponder unit, including one or more processors, on a receiving side, configured to perform transmission and reception of an optical signal through an optical transmission line in which an optical filter having a multiplexing/demultiplexing function of the optical signal is interposed, the first transponder unit on the transmitting side and the second transponder unit on the receiving side each including a respective transmission unit and a respective reception unit, the transmission unit of the first transponder unit configured to transmit the optical signal that has been generated by modulating laser light emitted from a laser light source with an electric signal from a communication apparatus to the optical transmission line, the reception unit of the second transponder unit configured to receive the optical signal from the transmission unit of the first transponder unit through the optical transmission line and convert the received optical signal into an electric signal, wherein the reception unit of the second transponder unit includes an optical power measurement unit, including one or more processors, configured to measure optical power of the optical signal received in the second transponder unit on the receiving side, and feed the measured optical power back to the first transponder unit on the transmitting side, the transmission unit of the first transponder unit includes a control unit, including one or more processors, configured to perform frequency shift control of shifting a center frequency of the laser light emitted from the laser light source in accordance with the fed back optical power so that the center frequency approaches a center frequency of the optical signal received in the transponder unit on the receiving side.

5. The optical transmission system according to claim 4, wherein the transmission unit of the first transponder unit includes an encoder unit, including one or more processors, configured to encode the electric signal from the communication apparatus into a multi-level signal, a digital/analog conversion unit, including one or more processors, configured to convert the multi-level signal output from the encoder unit into a digital signal, a quadrature modulation unit, including one or more processors, configured to output signal light obtained by performing quadrature modulation on the laser light with the multi-level signal being the converted digital signal, and a phase control unit, including one or more processors, configured to perform variable phase control of causing phase of the multi-level signal from the encoder unit to be advanced or delayed, in accordance with the fed back optical power.

6. The optical transmission system according to claim 4, wherein the transmission unit of the first transponder unit includes an encoder unit, including one or more processors, configured to encode the electric signal from the communication apparatus into a multi-level signal, the encoder unit including a frequency filter related to the encoding, a Nyquist control unit, including one or more processors, configured to perform Nyquist control on the frequency filter so that the fed back optical power is minimized, the Nyquist control being control of making a signal spectrum of the electric signal from the communication apparatus passing through the frequency filter have a Nyquist form.

7. The optical transmission system according to claim 4, wherein the control unit is configured to determine a frequency shift amount by which a center frequency of the optical filter is shifted so that the measured optical power is maximized, and transmit the determined frequency shift amount to the optical filter.

8. A method of reducing a filter penalty used in an optical transmission system, the optical transmission system including a first transponder unit on a transmitting side and a second transponder unit on a receiving side, configured to perform transmission and reception of an optical signal through an optical transmission line in which an optical filter having a multiplexing/demultiplexing function of the optical signal is interposed, the first transponder unit on the transmitting side and the second transponder unit on the receiving side each including a respective transmission unit and a respective reception unit, the transmission unit of the first transponder unit transmitting the optical signal that has been generated by modulating laser light emitted from a laser light source with an electric signal from a communication apparatus to the optical transmission line, the reception unit of the second transponder unit receiving the optical signal from the transmission unit of the first transponder unit through the optical transmission line and converting the received optical signal into an electric signal, the method comprising:

measuring, by the reception unit of the second transponder unit, a bit error rate (BER), based on a received signal of the second transponder unit on the receiving side, and feeding the measured BER back to the first transponder unit on the transmitting side;

performing, by the transmission unit of the first transponder unit, frequency shift control of shifting a center frequency of the laser light emitted from the laser light source in accordance with the fed back BER so that the center frequency approaches a center frequency of the optical signal received in the second transponder unit on the receiving side; and performing, by the transmission unit, the frequency shift control so that a value of the fed back BER is minimized, wherein minimizing the value of the fed back BER comprises repeatedly shifting the center frequency of the laser light and measuring and recording the corresponding feedback BER until a minimal fed back BER is reached.

9. The method of claim 8, further comprising:

encoding, by the transmission unit of the first transponder unit, the electric signal from the communication apparatus into a multi-level signal;

converting, by the transmission unit of the first transponder unit, the multi-level signal into a digital signal;

outputting, by the transmission unit of the first transponder unit, signal light obtained by performing quadrature modulation on the laser light with the multi-level signal being the converted digital signal; and performing, by the transmission unit of the first transponder unit, variable phase control causing phase of the multi-level signal to be advanced or delayed, in accordance with the fed back BER.

10. The method of claim 8, further comprising:

encoding, by the transmission unit, the electric signal from the communication apparatus into a multi-level signal; and performing, by the transmission unit, Nyquist control on the frequency filter in accordance with the fed back BER.

\* \* \* \* \*